United States Patent
See et al.

(10) Patent No.: US 8,975,981 B2
(45) Date of Patent: Mar. 10, 2015

(54) IMPEDANCE MATCHING CIRCUITS WITH MULTIPLE CONFIGURATIONS

(75) Inventors: Puay Hoe See, San Diego, CA (US); Xiangdong Zhang, Westford, MA (US)

(73) Assignee: QUALCOMM Incorporated, San Diego, CA (US)

( * ) Notice: Subject to any disclaimer, the term of this patent is extended or adjusted under 35 U.S.C. 154(b) by 122 days.

(21) Appl. No.: 13/231,824

(22) Filed: Sep. 13, 2011

(65) Prior Publication Data

US 2013/0063223 A1     Mar. 14, 2013

(51) Int. Cl.
*H03H 7/38* (2006.01)
*H03F 1/56* (2006.01)

(52) U.S. Cl.
CPC ... *H03F 1/56* (2013.01); *H03H 7/38* (2013.01)
USPC .......................................................... 333/32

(58) Field of Classification Search
CPC .................................. H03H 7/38; H03H 7/40
USPC .................................... 333/32, 17.3
See application file for complete search history.

(56) References Cited

U.S. PATENT DOCUMENTS

| | | | |
|---|---|---|---|
| 7,557,773 B2 | 7/2009 | Sekiguchi et al. | |
| 7,640,040 B2 | 12/2009 | Poilasne et al. | |
| 7,671,693 B2 * | 3/2010 | Brobston et al. | 333/17.3 |
| 7,747,228 B2 | 6/2010 | Kasha et al. | |
| 7,750,757 B2 * | 7/2010 | Fukuda et al. | 333/32 |
| 2008/0305749 A1 | 12/2008 | Ben-Bassat | |
| 2010/0273441 A1 | 10/2010 | Dubash et al. | |

FOREIGN PATENT DOCUMENTS

| | | |
|---|---|---|
| EP | 1605589 A1 | 12/2005 |
| EP | 1887705 A2 | 2/2008 |
| EP | 1916735 A1 | 4/2008 |
| JP | 9307459 A | 11/1997 |
| WO | WO-9639727 A1 | 12/1996 |

OTHER PUBLICATIONS

International Search Report and Written Opinion—PCT/US2012/055251—ISA/EPO—May 24, 2013.
Partial International Search Report—PCT/US2012/055251—ISA/EPO—Mar. 13, 2013.

* cited by examiner

*Primary Examiner* — Stephen E Jones
(74) *Attorney, Agent, or Firm* — Ramin Mobarhan

(57) ABSTRACT

Reconfigurable impedance matching circuits with multiple configurations are disclosed. A reconfigurable impedance matching circuit may be implemented with a set of reactive elements (e.g., inductors and/or capacitors) and a set of switches. Different configurations may be obtained with different settings of the switches and may be associated with different impedance tuning curves. This may enable the reconfigurable impedance matching circuit to provide better impedance matching for a load circuit (e.g., an antenna). In an exemplary design, the reconfigurable impedance matching circuit includes at least one variable reactive element configured to tune the impedance of the reconfigurable impedance matching circuit in order to provide better impedance matching. In an exemplary design, the reconfigurable impedance matching circuit may include at least one reconfigurable reactive element, each of which can be connected as a series element or a shunt element.

21 Claims, 16 Drawing Sheets

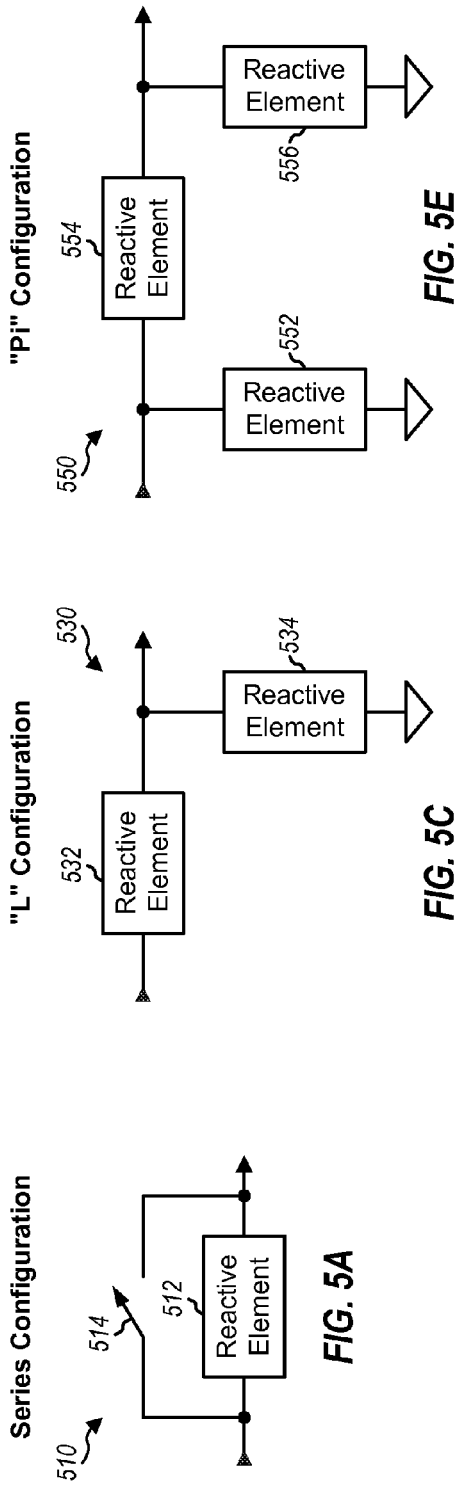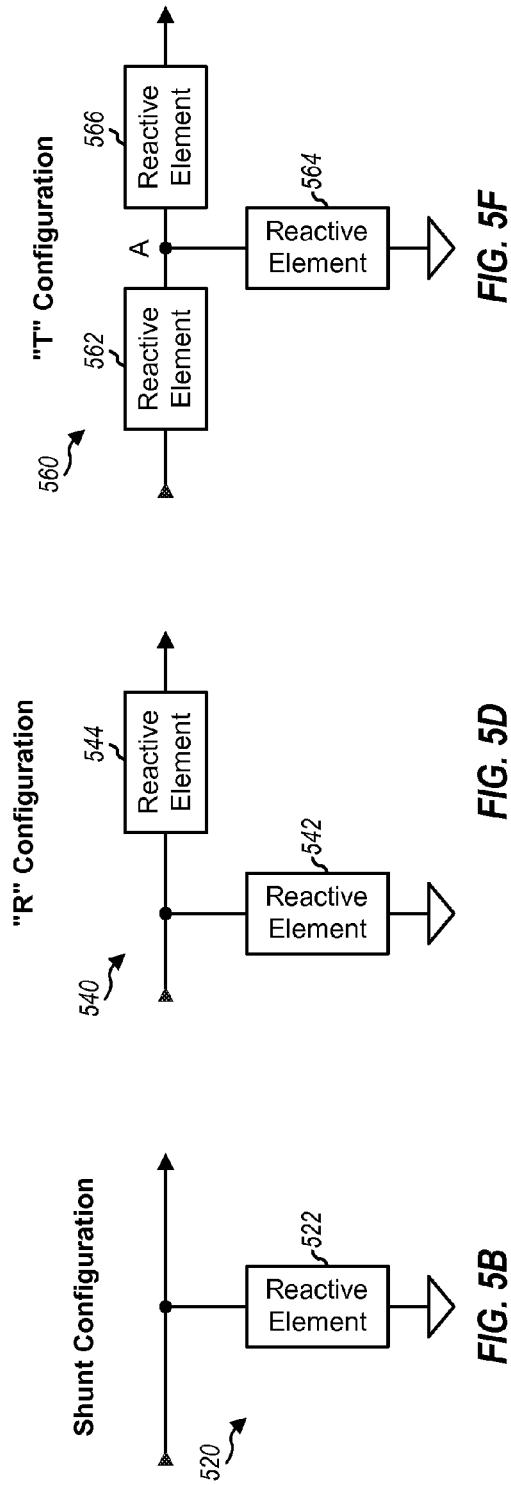

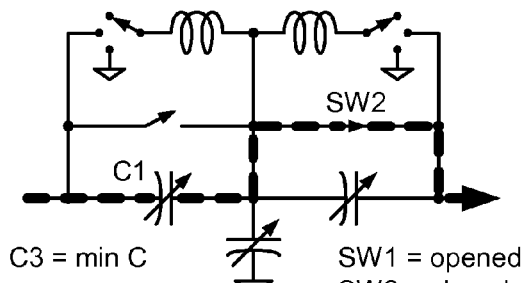

Series Configuration
with Series C1

C3 = min C

SW1 = opened
SW2 = closed
SW3 = float
SW4 = float

FIG. 8C

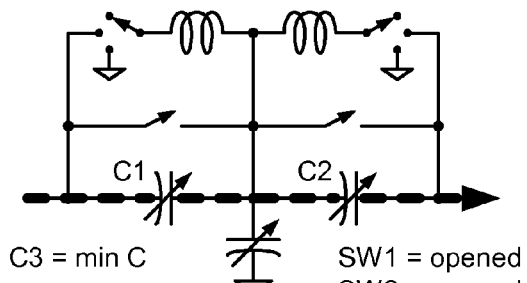

Series Configuration
with Series C1 & C2

C3 = min C

SW1 = opened
SW2 = opened
SW3 = float
SW4 = float

FIG. 8D

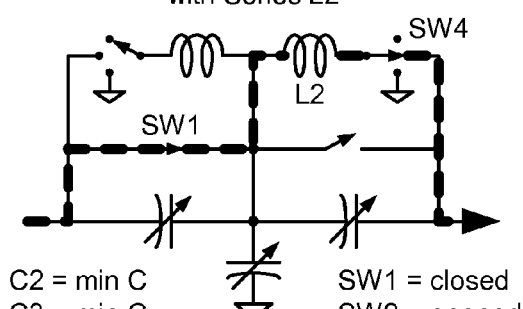

Series Configuration
with Series L2

C2 = min C
C3 = min C

SW1 = closed
SW2 = opened
SW3 = float
SW4 = output

FIG. 8E

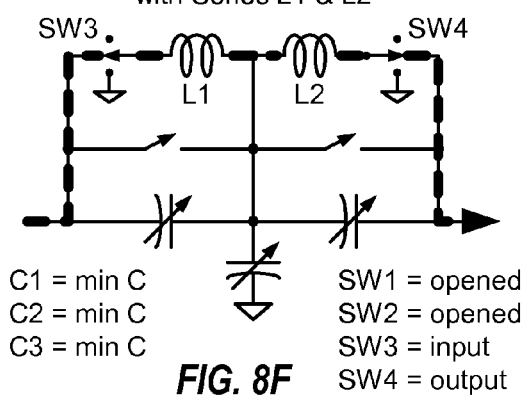

Series Configuration
with Series L1 & L2

C1 = min C
C2 = min C
C3 = min C

SW1 = opened
SW2 = opened
SW3 = input
SW4 = output

FIG. 8F

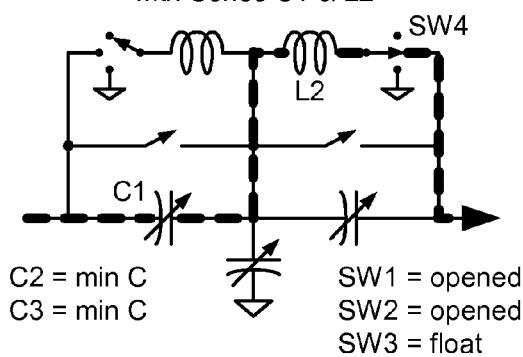

Series Configuration
with Series C1 & L2

C2 = min C
C3 = min C

SW1 = opened
SW2 = opened
SW3 = float
SW4 = output

FIG. 8G

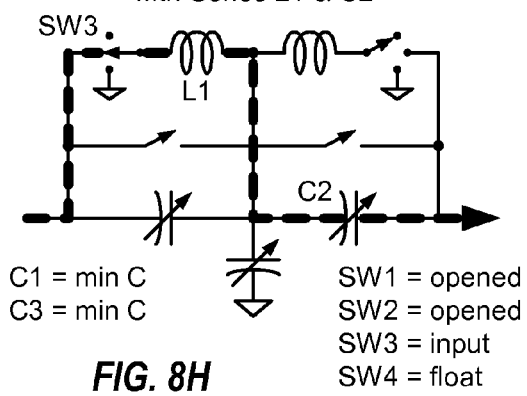

Series Configuration
with Series L1 & C2

C1 = min C
C3 = min C

SW1 = opened
SW2 = opened
SW3 = input
SW4 = float

FIG. 8H

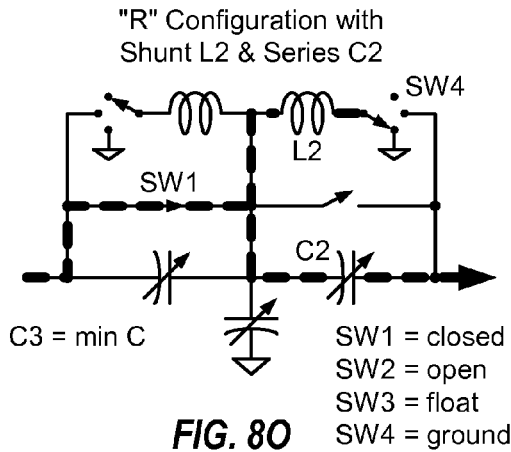

"R" Configuration with Shunt L2 & Series C2

C3 = min C

SW1 = closed
SW2 = open
SW3 = float
SW4 = ground

FIG. 8O

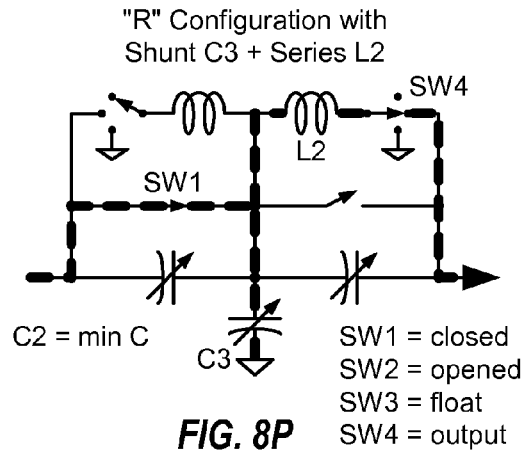

"R" Configuration with Shunt C3 + Series L2

C2 = min C

SW1 = closed
SW2 = opened
SW3 = float
SW4 = output

FIG. 8P

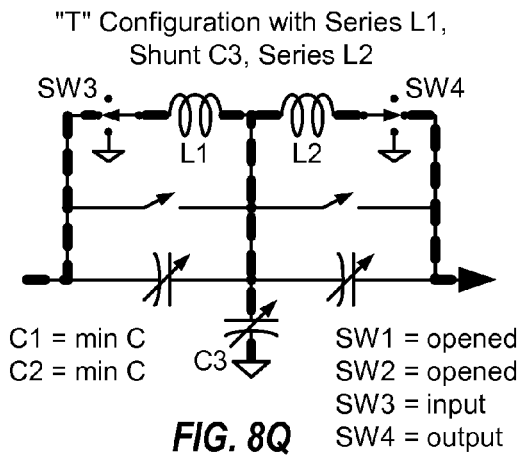

"T" Configuration with Series L1, Shunt C3, Series L2

C1 = min C
C2 = min C

SW1 = opened
SW2 = opened
SW3 = input
SW4 = output

FIG. 8Q

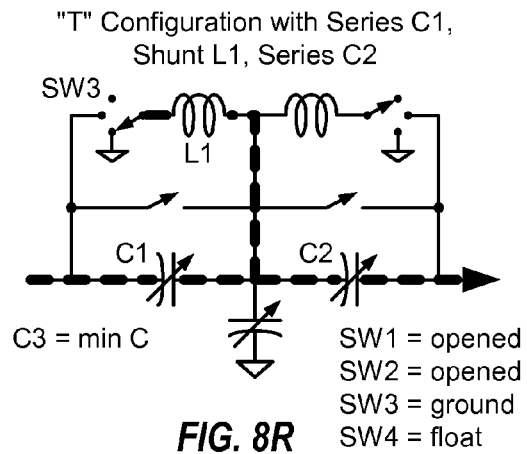

"T" Configuration with Series C1, Shunt L1, Series C2

C3 = min C

SW1 = opened
SW2 = opened
SW3 = ground
SW4 = float

FIG. 8R

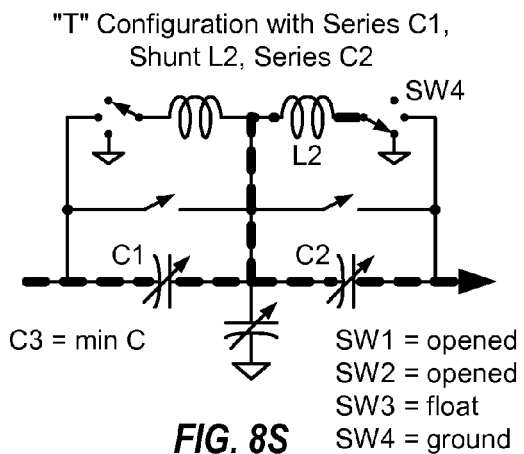

"T" Configuration with Series C1, Shunt L2, Series C2

C3 = min C

SW1 = opened
SW2 = opened
SW3 = float
SW4 = ground

FIG. 8S

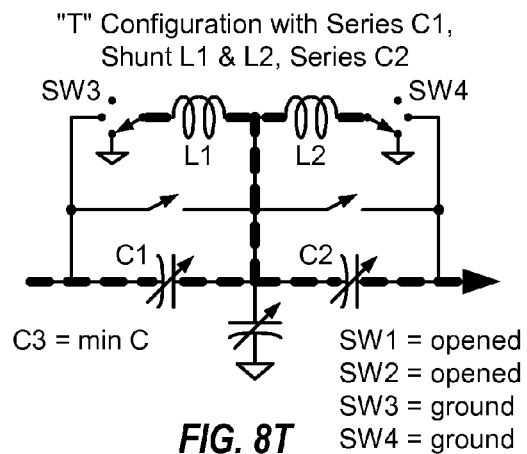

"T" Configuration with Series C1, Shunt L1 & L2, Series C2

C3 = min C

SW1 = opened
SW2 = opened
SW3 = ground
SW4 = ground

FIG. 8T

Topology 2

Topology 3

Topology 4

| Circuit Setting | Freq | Config | Switch Settings | Control Settings | Band/Mode |
|---|---|---|---|---|---|
| 1 | F1 | Config a | SW1 ... | C1 ... | B1 |
| 2 | F2 | Config b | SW1 ... | C1 ... | B2 |
| ⋮ | ⋮ | ⋮ | ⋮ | ⋮ | ⋮ |
| K | FK | Config b | SW1 ... | C1 ... | BK |

IMPEDANCE MATCHING CIRCUITS WITH MULTIPLE CONFIGURATIONS

BACKGROUND

I. Field

The present disclosure relates generally to electronics, and more specifically to impedance matching circuits suitable for use in wireless devices.

II. Background

A wireless device (e.g., a cellular phone or a smart phone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated signal, amplify the modulated signal to obtain an output RF signal having the proper output power level, and transmit the output RF signal via an antenna to a base station. For data reception, the receiver may obtain a received RF signal via the antenna and may condition and process the received RF signal to recover data sent by the base station.

The transmitter may include various circuits such as a power amplifier (PA), a filter, etc. The receiver may also include various circuits such as a low noise amplifier (LNA), a filter, etc. An impedance matching circuit may be coupled between the antenna and the transmitter and/or the receiver and may perform impedance matching for the antenna, the power amplifier, or the LNA. The impedance matching circuit may have a large impact on the performance of the wireless device.

BRIEF DESCRIPTION OF THE DRAWINGS

FIGS. 5A to 5F show impedance matching circuits of different configurations.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Impedance matching circuits with multiple configurations are described herein and are also referred to as reconfigurable impedance matching circuits. A reconfigurable impedance matching circuit includes a set of reactive elements/components and a set of switches. A reactive element may be an inductor or a capacitor. Different configurations may be obtained by controlling the switches to connect the reactive elements in different arrangements, as described below. For example, one end of a given reactive element may be connected to one of multiple nodes in the reconfigurable impedance matching circuit via switches. Each configuration of the reconfigurable impedance matching circuit corresponds to a different arrangement of the reactive elements. The multiple configurations of the reconfigurable impedance matching circuit may support a wider range of impedance values and may enable better impedance matching, which may improve performance.

The reconfigurable impedance matching circuits described herein may be used for wireless devices of various types such as cellular phones, smart phones, tablets, personal digital assistants (PDAs), handheld devices, wireless modems, laptop computers, smartbooks, netbooks, cordless phones, wireless local loop (WLL) stations, Bluetooth devices, consumer electronic devices, etc.

Figure 1:
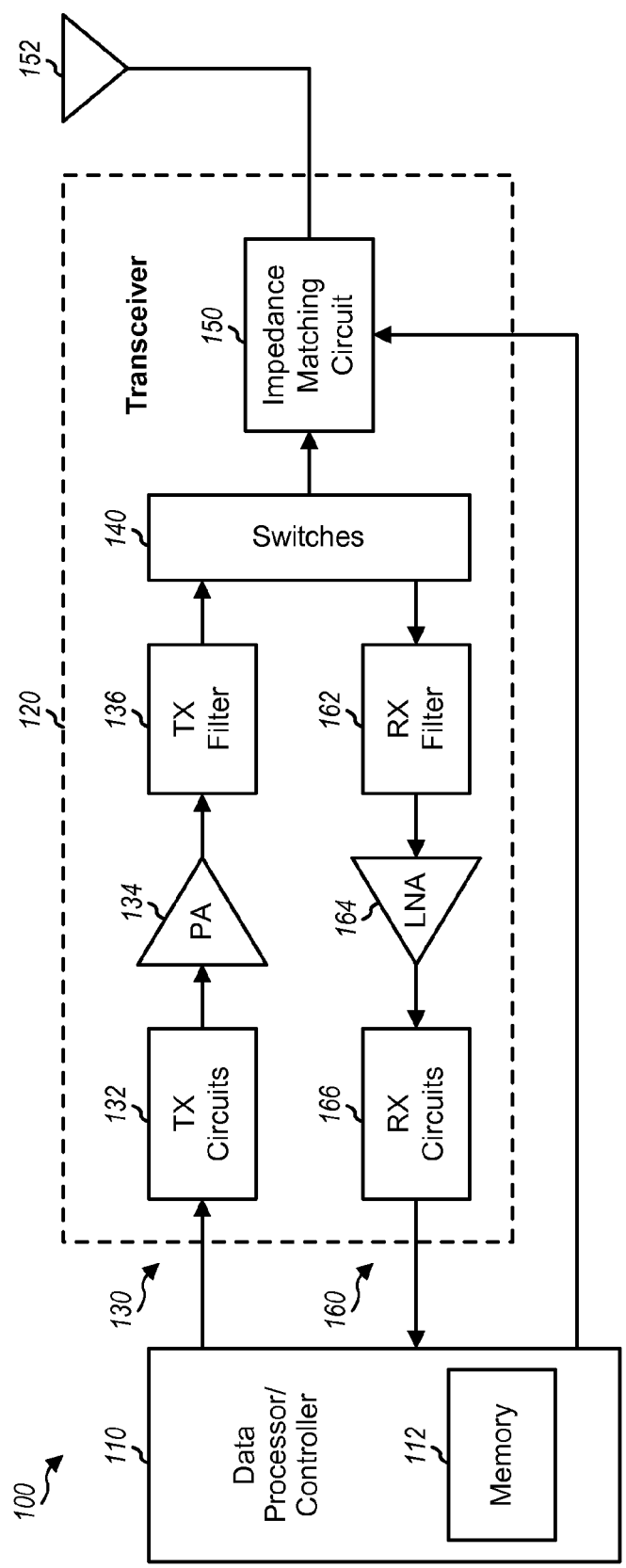
FIGS. 1, 2 and 3 show three exemplary designs of a wireless device.

FIG. 1 shows a block diagram of an exemplary design of a wireless device 100. In this exemplary design, wireless device 100 includes a data processor/controller 110, a transceiver 120, and an antenna 152. Transceiver 120 includes a transmitter 130 and a receiver 160 that support bi-directional wireless communication. Wireless device 100 may support Long Term Evolution (LTE), Code Division Multiple Access (CDMA) 1X or cdma2000, Wideband CDMA (WCDMA), Global System for Mobile Communications (GSM), 802.11, etc.

In the transmit path, data processor 110 processes (e.g., encodes and modulates) data to be transmitted and provides an analog output signal to transmitter 130. Within transmitter 130, transmit (TX) circuits 132 amplify, filter, and upconvert the analog output signal from baseband to RF and provide a modulated signal. TX circuits 132 may include amplifiers, filters, mixers, an oscillator, a local oscillator (LO) generator, a phase locked loop (PLL), etc. A power amplifier (PA) 134 receives and amplifies the modulated signal and provides an amplified RF signal having the proper output power level. A TX filter 136 filters the amplified RF signal to pass signal components in a transmit band and attenuate signal components in a receive band. TX filter 136 provides an output RF signal, which is routed through switches 140 and an impedance matching circuit 150 and transmitted via antenna 152. Impedance matching circuit 150 performs impedance matching for antenna 152 and is also referred to as an antenna tuning circuit, a tunable matching circuit, etc.

In the receive path, antenna 152 receives signals from base stations and/or other transmitter stations and provides a received RF signal, which is routed through impedance matching circuit 150 and switches 140 and provided to receiver 160. Within receiver 160, a receive (RX) filter 162 filters the received RF signal to pass signal components in the receive band and attenuate signal components in the transmit band. An LNA 164 amplifies a filtered RF signal from RX filter 162 and provides an input RF signal. RX circuits 166 amplify, filter, and downconvert the input RF signal from RF to baseband and provide an analog input signal to data processor 110. RX circuits 166 may include amplifiers, filters, mixers, an oscillator, an LO generator, a PLL, etc.

FIG. 1 shows an exemplary design of transceiver 120. All or a portion of transceiver 120 may be implemented on one or more analog integrated circuits (ICs), RF ICs (RFICs), mixed-signal ICs, etc. For example, TX circuits 132, power amplifier 134, LNA 164, and RX circuits 166 may be implemented on an RFIC. Power amplifier 134 and possibly other circuits may also be implemented on a separate IC or module. Impedance matching circuit 150 and possibly other circuits may also be implemented on a separate IC or module.

Data processor/controller 110 may perform various functions for wireless device 100. For example, data processor 110 may perform processing for data being transmitted via transmitter 130 and received via receiver 160. Controller 110 may control the operation of TX circuits 132, RX circuits 166, switches 140, and/or impedance matching circuit 150. A memory 112 may store program codes and data for data processor/controller 110. Memory 112 may be internal to data processor/controller 110 (as shown in FIG. 1) or external to data processor/controller 110 (not shown in FIG. 1). Data processor/controller 110 may be implemented on one or more application specific integrated circuits (ASICs) and/or other ICs.

Figure 2:
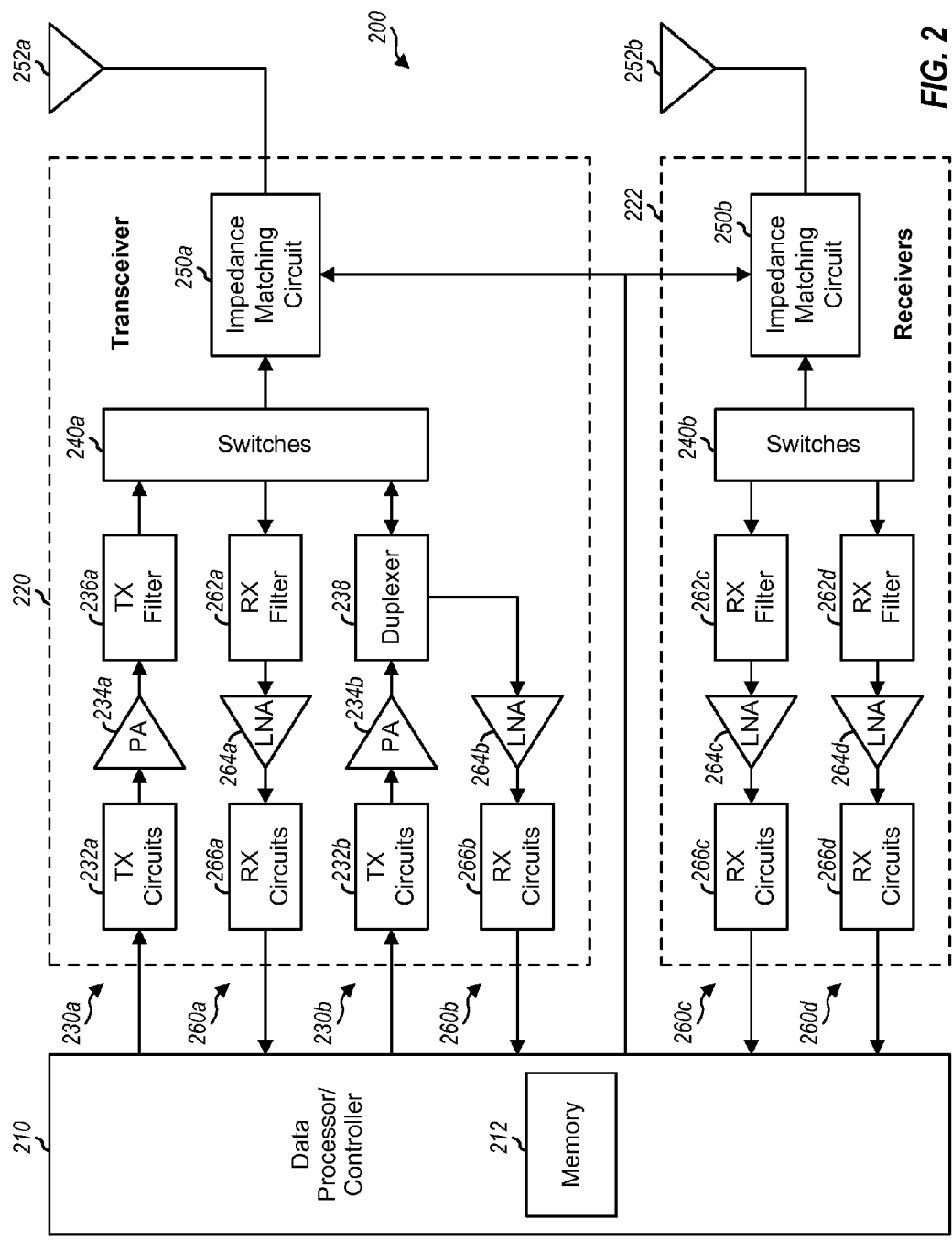

FIG. 2 shows a block diagram of an exemplary design of a wireless device 200. In this exemplary design, wireless device 200 includes a data processor/controller 210, a transceiver 220 for a primary antenna 252a, and receivers 222 for a secondary antenna 252b. Transceiver 220 includes (i) a transmitter 230a and a receiver 260a that support bi-directional wireless communication for a first mode/band (e.g., GSM) and (ii) a transmitter 230b and a receiver 260b that support bi-directional wireless communication for a second mode/band (LTE, cdma2000, or WCDMA). A mode may correspond to LTE, cdma2000, WCDMA, GSM, etc. Receivers 222 include receivers 260c and 260d that support data reception.

Within transceiver 220, transmitter 230a includes TX circuits 232a, a power amplifier 234a, and a TX filter 236a. Receiver 260a includes an RX filter 262a, an LNA 264a, and RX circuits 266a. Transmitter 230b includes TX circuits 232b, a power amplifier 234b, and a duplexer 238. Receiver 260b includes duplexer 238, an LNA 264b, and RX circuits 266b. Switches 240a are coupled to TX filter 236a, RX filter 262a, and duplexer 238. Duplexer 238 routes an amplified RF signal from power amplifier 234b to switches 240a and also routes a received RF signal from switches 240a to LNA 264b. An impedance matching circuit 250a is coupled between switches 240a and antenna 252a.

Within receivers 222, receiver 260c includes an RX filter 262c, an LNA 264c, and RX circuits 266c. Receiver 260d includes an RX filter 262d, an LNA 264d, and RX circuits 266d. Switches 240b are coupled to RX filters 262c and 262d. An impedance matching circuit 250b is coupled between switches 240b and antenna 252b.

Figure 3:
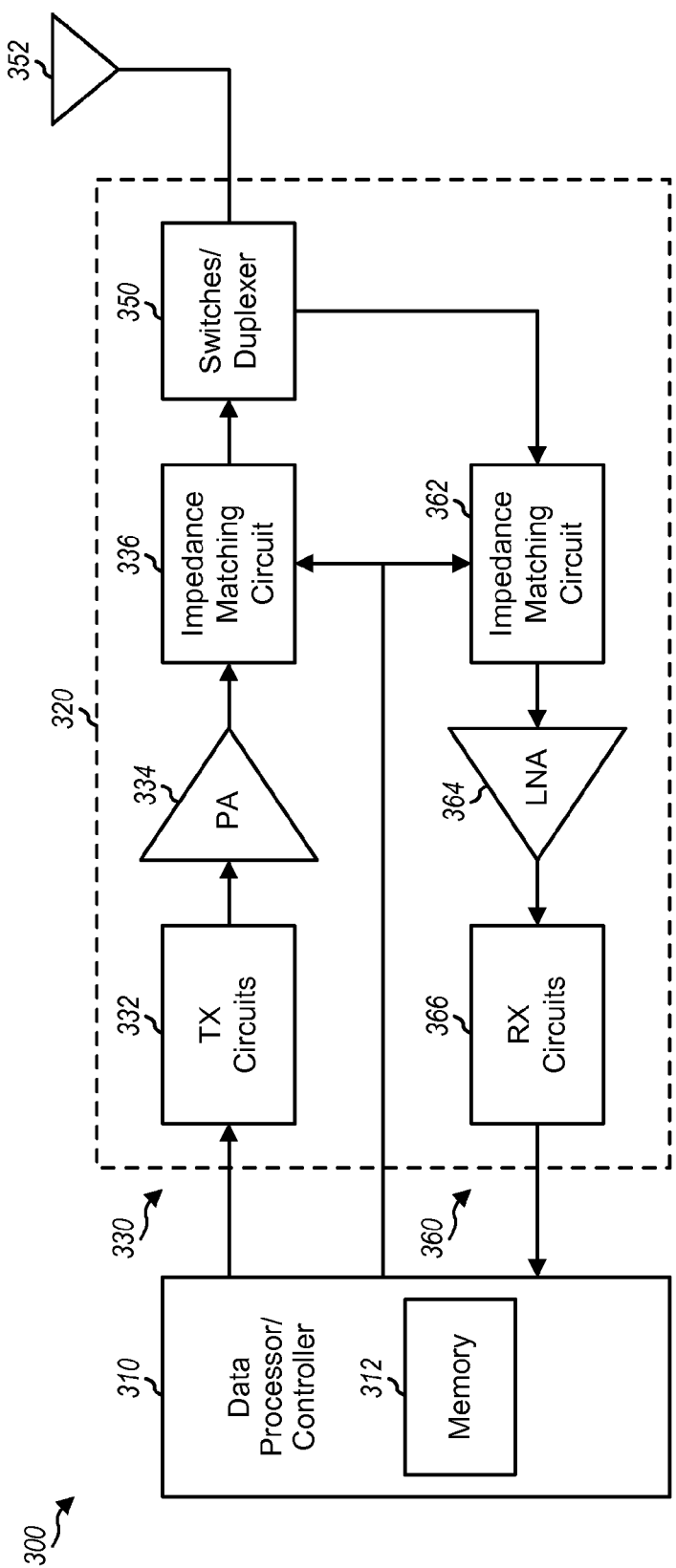

FIG. 3 shows a block diagram of an exemplary design of a wireless device 300. In this exemplary design, wireless device 300 includes a data processor/controller 310, a transceiver 320, and an antenna 352. Transceiver 320 includes a transmitter 330 and a receiver 360 that support bi-directional wireless communication. Transmitter 330 includes TX circuits 332, a power amplifier 334, and an impedance matching circuit 336 coupled in series. Receiver 360 includes an impedance matching circuit 362, an LNA 364, and RX circuits 366 coupled in series. Switches/duplexer 350 is coupled to impedance matching circuits 336 and 362 and also to antenna 352.

FIGS. 1, 2 and 3 show three exemplary designs of wireless devices 100, 200 and 300, respectively. In general, a wireless device may include any number of antennas, any number of transmitters, and any number of receivers. A wireless device may also support operation on any number of frequency bands. A wireless device may include one or more transmitters and/or one or more receivers for each antenna. Each transmitter and each receiver may support operation on one or more frequency bands for a given antenna.

A wireless device may support communication with time division duplex (TDD) systems and/or frequency division duplex (FDD) systems. For communication with a TDD system, the wireless device may include switches (e.g., switches 140 in FIG. 1) that can couple an antenna to either a transmitter or a receiver at any given moment. For communication with a FDD system, the wireless device may include a duplexer (e.g., duplexer 238 in FIG. 2) that can simultaneously route (i) an output RF signal from a power amplifier to an antenna and (ii) a received RF signal from the antenna to an LNA.

As shown in FIGS. 1, 2 and 3, impedance matching circuits may be included at various locations in a wireless device and used to match the impedance of circuits coupled to the input and output of the impedance matching circuit. For example, an impedance matching circuit (e.g., impedance matching circuit 150 in FIG. 1) may perform impedance matching between an output impedance of a filter and an impedance of an antenna. An impedance matching circuit (e.g., impedance matching circuit 336 in FIG. 3) may also perform impedance matching between an output impedance of an amplifier and an input impedance of a filter or an antenna.

The impedance of an antenna (e.g., antenna 152 in FIG. 1) may vary widely from one antenna design to another antenna design. Furthermore, the antenna impedance may vary widely with frequency, as shown below. The antenna impedance may also change due to proximity of human body (e.g., hand, face, etc.) on a wireless device. An impedance matching circuit (e.g., impedance matching circuit 150 in FIG. 1) may be used to match the impedance of the antenna to an output impedance of a filter (e.g., TX filter 136 in FIG. 1) so that good performance can be achieved.

Figure 4:
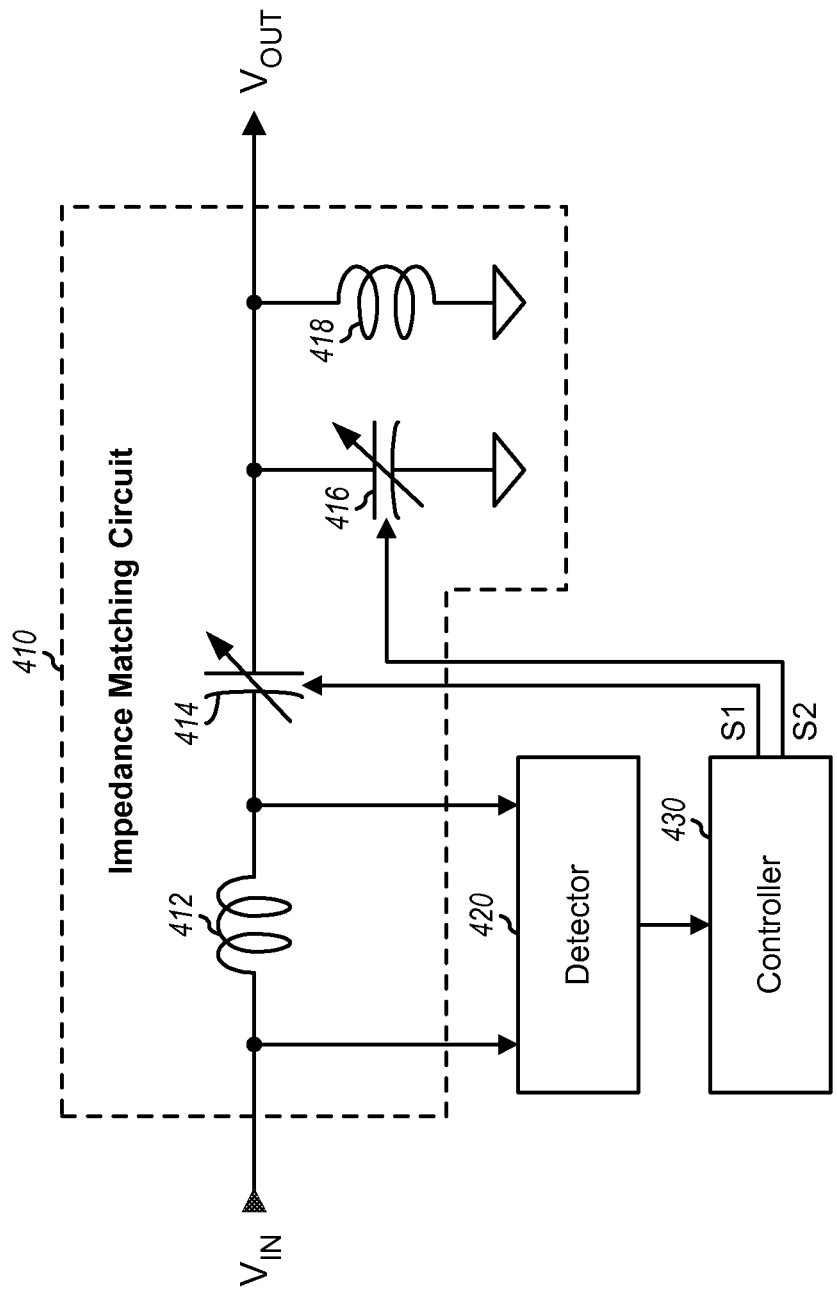
FIG. 4 shows a schematic diagram of an adjustable impedance matching circuit.

FIG. 4 shows a schematic diagram of an impedance matching circuit 410 that is adjustable but not reconfigurable. Impedance matching circuit 410 receives an input signal ($V_{IN}$) and provides an output signal ($V_{OUT}$). Within impedance matching circuit 410, an inductor 412 and a variable capacitor (varactor) 414 are coupled in series, and the series combination is coupled between an input and an output of impedance matching circuit 410. A varactor 416 and an inductor 418 are coupled in parallel, and the parallel combination is coupled between the output of impedance matching circuit 410 and circuit ground. Varactor 414 has a variable capacitance within a first range of values, which is dependent on the design and implementation of varactor 414. Varactor 416 has a variable capacitance within a second range of values, which is dependent on the design and implementation of varactor 416.

A detector 420 has two inputs coupled to the two ends of inductor 412 and an output coupled to a controller 430. Detector 420 detects a voltage across inductor 412 and provides the detected voltage to controller 430. Controller 430 estimates the power delivered at the output of impedance matching circuit 410 based on the detected voltage and the known impedance of inductor 412. Controller 430 generates a first control signal (S1) for varactor 414 and a second control signal (S2) for varactor 416 to obtain the desired delivered power at the output of impedance matching circuit 410. In particular, controller 430 may generate the first control signal to vary the capacitance of varactor 414 and/or generate the second control signal to vary the capacitance of varactor 416 based on the detected voltage from detector 420.

An impedance matching circuit (e.g., impedance matching circuit 410 in FIG. 4) typically has a single fixed configuration. This configuration indicates how each reactive element (i.e., each inductor and each varactor) in the impedance matching circuit is connected. In particular, each reactive element is coupled between two specific nodes in the impedance matching circuit for a fixed configuration. Some reactive elements (e.g., inductors 412 and 418) may have fixed impedances, and other reactive elements (e.g., varactors 414 and 416) may have variable impedances. The impedance of a variable reactive element (e.g., a varactor) may be adjusted to vary the impedance of the impedance matching circuit. The fixed configuration restricts how the impedance of the impedance matching circuit can be tuned, which limits the impedance matching capability of the impedance matching circuit.

The impedance of an impedance matching circuit may be adjusted in a range of values, which may be referred to as an impedance tuning curve. The impedance tuning curve may be dependent on the configuration of the impedance matching circuit and the variable reactive element(s) in the impedance matching circuit. Different configurations may be associated with different impedance tuning curves.

FIG. 5A shows a 1-element impedance matching circuit 510 with a single reactive element 512 coupled in a series configuration. Reactive element 512 may be a capacitor or an inductor and is coupled between an input and an output of impedance matching circuit 510. A switch 514 is coupled in parallel with reactive element 512. When switch 514 is opened, impedance matching circuit 510 has a series-coupled reactive element 512. When switch 514 is closed, impedance matching circuit 510 has a through configuration and simply passes an input signal.

FIG. 5B shows a 1-element impedance matching circuit 520 with a single reactive element 522 coupled in a shunt configuration. Reactive element 522 may be a capacitor or an inductor and is coupled between the input/output of impedance matching circuit 520 and circuit ground.

FIG. 5C shows a 2-element impedance matching circuit 530 with two reactive elements 532 and 534 coupled in an "L" configuration. Each reactive element may be a capacitor or an inductor. Reactive element 532 is coupled between an input and an output of impedance matching circuit 530. Reactive element 534 is coupled between the output of impedance matching circuit 530 and circuit ground.

FIG. 5D shows a 2-element impedance matching circuit 540 with two reactive elements 542 and 544 coupled in an "R" configuration. Each reactive element may be a capacitor or an inductor. Reactive element 542 is coupled between an input of impedance matching circuit 540 and circuit ground. Reactive element 544 is coupled between the input and output of impedance matching circuit 540. The "L" configuration in FIG. 5C has a reactive element coupled between the output of the impedance matching circuit and circuit ground whereas the "R" configuration in FIG. 5D has a reactive element coupled between the input of the impedance matching circuit and circuit ground.

FIG. 5E shows a 3-element impedance matching circuit 550 with three reactive elements 552, 554 and 556 coupled in a "Pi" configuration. Each reactive element may be a capacitor or an inductor. Reactive element 552 is coupled between an input of impedance matching circuit 550 and circuit ground. Reactive element 554 is coupled between the input and output of impedance matching circuit 550. Reactive element 556 is coupled between the output of impedance matching circuit 550 and circuit ground.

FIG. 5F shows a 3-element impedance matching circuit 560 with three reactive elements 562, 564 and 566 coupled in a "T" configuration. Each reactive element may be a capacitor or an inductor. Reactive element 562 is coupled between an input of impedance matching circuit 560 and node A. Reactive element 564 is coupled between node A and circuit ground. Reactive element 566 is coupled between node A and an output of impedance matching circuit 560.

FIGS. 5A to 5F show six exemplary impedance matching circuit configurations. Other impedance matching circuit configurations may also be formed with 1, 2, 3 or more reactive elements. Each impedance matching circuit configuration may be associated with a specific impedance tuning curve that indicates impedance values achievable with that impedance matching circuit configuration. Different impedance matching circuit configurations may be associated with different impedance tuning curves.

Figure 6B:
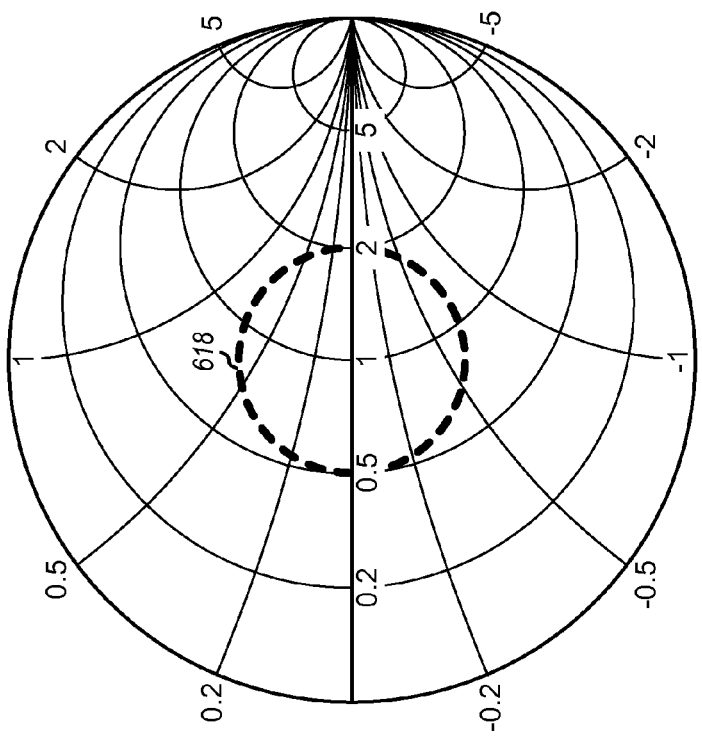
FIGS. 6A to 6D show Smith charts of impedance tuning curves for the impedance matching circuits in FIGS. 5A to 5F.
Figure 6A:
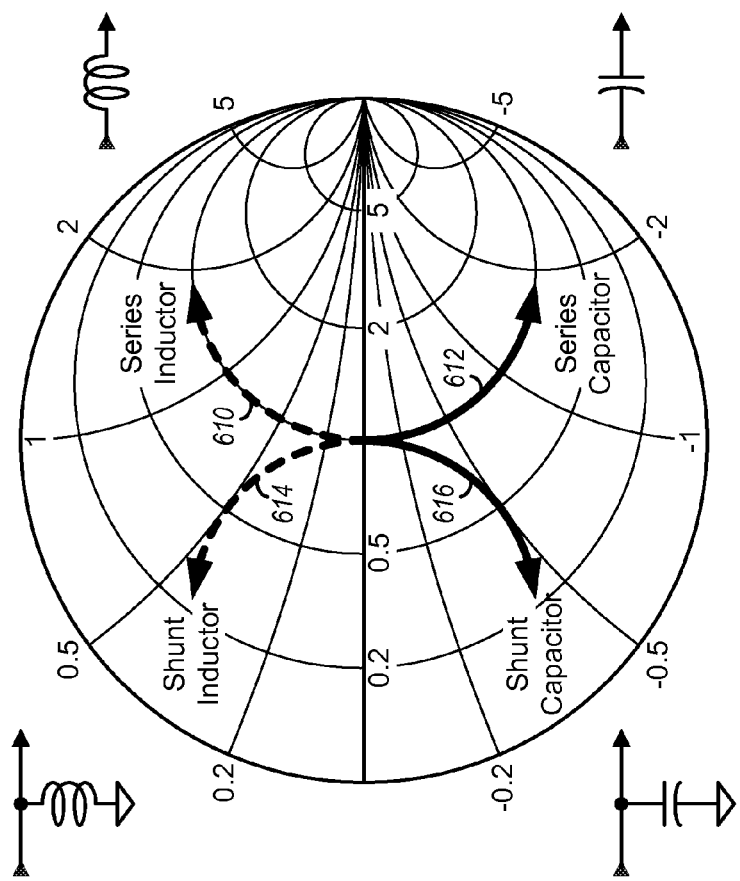

FIG. 6A shows a Smith chart illustrating impedance tuning curves for 1-element impedance matching circuit 510 with the series configuration in FIG. 5A. A Smith chart is a common way for describing complex-valued impedance normalized to a characteristic impedance ($Z_O$), which may be 50 or 75 Ohms. The center of the Smith chart corresponds to $Z_O$. The half-circle above the horizontal axis denotes positive impedance, and the half-circle below the horizontal axis denotes negative impedance.

A plot 610 shows an impedance tuning curve for impedance matching circuit 510 with reactive element 512 being a series inductor. Progressively larger inductance corresponds to progressively larger positive impedance, as indicated by the arrow at the end of plot 610. The impedance tuning curve given by plot 610 is dependent on the range of inductance values for the series inductor.

A plot 612 shows an impedance tuning curve for impedance matching circuit 510 with reactive element 512 being a series capacitor. Progressively smaller capacitance corresponds to progressively larger negative impedance, as indicated by the arrow at the end of plot 612. The impedance tuning curve given by plot 612 is dependent on the range of capacitance values for the series capacitor.

FIG. 6A also shows impedance tuning curves for 1-element impedance matching circuit 520 with the shunt configuration in FIG. 5B. A plot 614 shows an impedance tuning curve for impedance matching circuit 520 with reactive element 522 being a shunt inductor. Progressively smaller inductance corresponds to progressively smaller positive impedance, as indicated by the arrow at the end of plot 614. The impedance tuning curve given by plot 614 is dependent on the range of inductance values for the shunt inductor.

A plot 616 shows a range of impedance values for impedance matching circuit 520 with reactive element 522 being a shunt capacitor. Progressively larger capacitance corresponds to progressively smaller negative impedance, as indicated by the arrow at the end of plot 616. The impedance tuning curve given by plot 616 is dependent on the range of capacitance values for the shunt capacitor.

FIG. 6B shows a Smith chart illustrating an impedance tuning curve of impedance matching circuit 510 in FIG. 5A in the through configuration. In an exemplary design, the through configuration may be used if the impedance of an antenna falls inside a dashed circle shown by a plot 618.

Figure 6C:
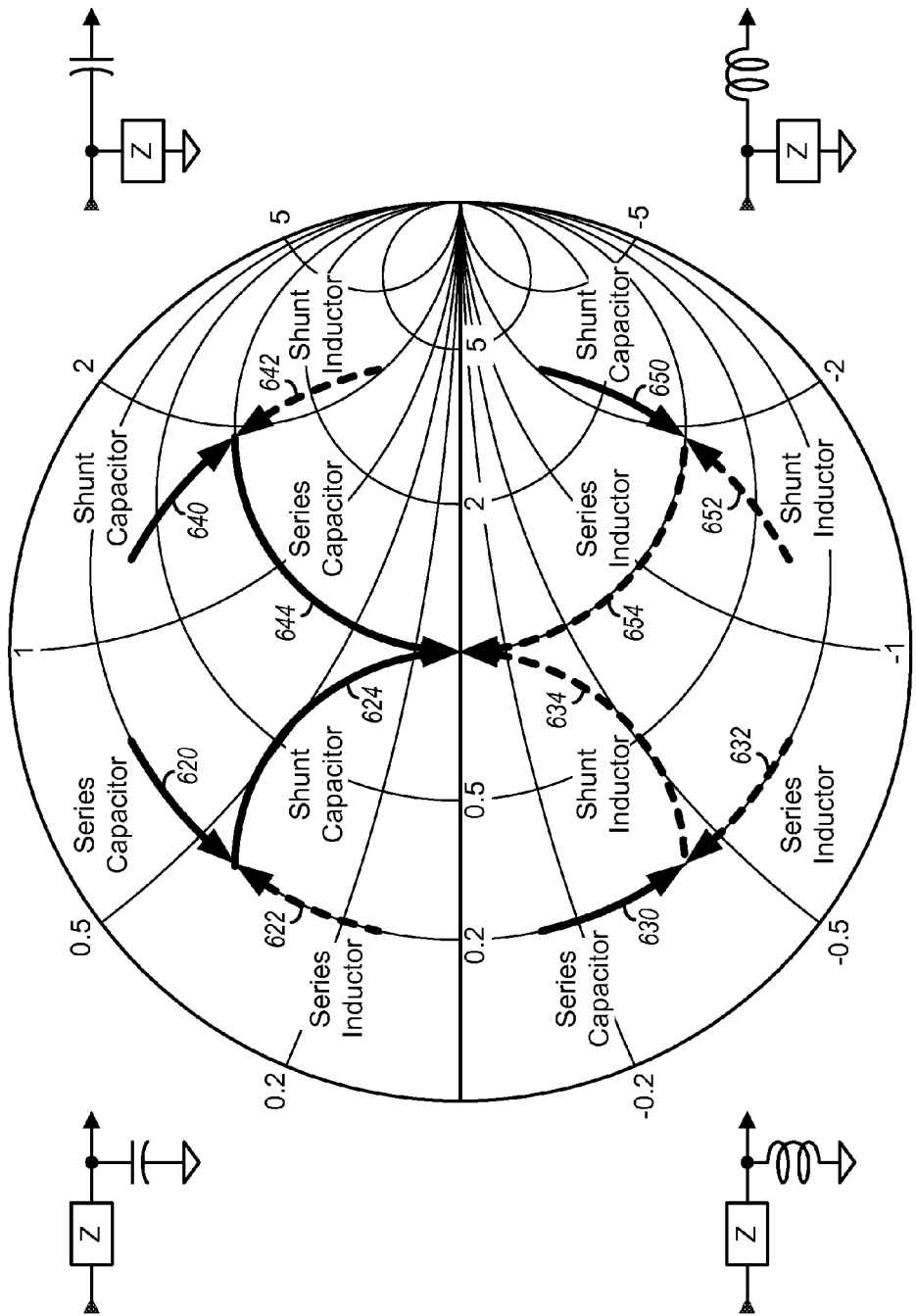

FIG. 6C shows a Smith chart illustrating the impedance tuning characteristics of 2-element impedance matching circuit 530 with the "L" configuration in FIG. 5C. Plots 620 and 624 show an impedance tuning curve for impedance matching circuit 530 with reactive element 532 being a series capacitor and reactive element 534 being a shunt capacitor. Plots 622 and 624 show an impedance tuning curve for impedance matching circuit 530 with reactive element 532 being a series inductor and reactive element 534 being a shunt capacitor. Plots 630 and 634 show an impedance tuning curve for impedance matching circuit 530 with reactive element 532 being a series capacitor and reactive element 534 being a shunt inductor. Plots 632 and 634 show an impedance tuning curve for impedance matching circuit 530 with reactive element 532 being a series inductor and reactive element 534 being a shunt inductor.

FIG. 6C also shows impedance tuning curves for 2-element impedance matching circuit 540 with the "R" configuration in FIG. 5D. Plots 640 and 644 show an impedance tuning curve for impedance matching circuit 540 with reactive element 542 being a shunt capacitor and reactive element 544 being a series capacitor. Plots 642 and 644 show an impedance tuning curve for impedance matching circuit 540 with reactive element 542 being a shunt inductor and reactive element 544 being a series capacitor. Plots 650 and 654 show an impedance tuning curve for impedance matching circuit 540 with reactive element 542 being a shunt capacitor and reactive element 544 being a series inductor. Plots 652 and 654 show an impedance tuning curve for impedance matching circuit 540 with reactive element 542 being a shunt inductor and reactive element 544 being a series inductor.

Figure 6D:
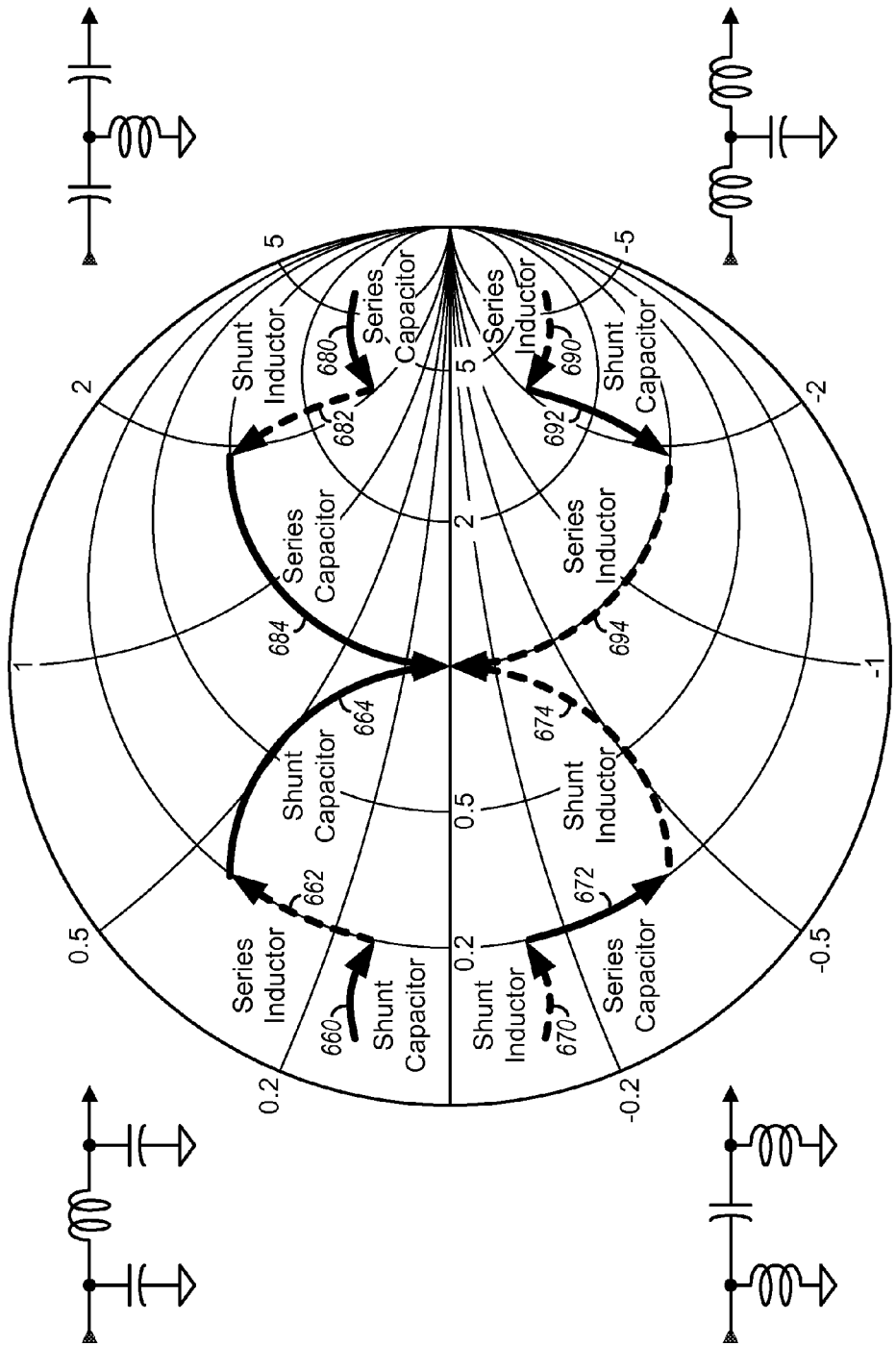

FIG. 6D shows a Smith chart illustrating impedance tuning curves of 3-element impedance matching circuit 550 with the "Pi" configuration in FIG. 5E. Plots 660, 662 and 664 show an impedance tuning curve for impedance matching circuit 550 with reactive element 552 being a shunt capacitor, reactive element 554 being a series inductor, and reactive element 556 being a shunt capacitor. Plots 670, 672 and 674 show an impedance tuning curve for impedance matching circuit 550 with reactive element 552 being a shunt inductor, reactive element 554 being a series capacitor, and reactive element 556 being a shunt inductor.

FIG. 6D also shows impedance tuning curves for 3-element impedance matching circuit 560 with the "T" configuration in FIG. 5F. Plots 680, 682 and 684 show an impedance tuning curve for impedance matching circuit 560 with reactive element 562 being a series capacitor, reactive element 564 being a shunt inductor, and reactive element 566 being a series capacitor. Plots 690, 692 and 694 show an impedance tuning curve for impedance matching circuit 560 with reactive element 562 being a series inductor, reactive element 564 being a shunt capacitor, and reactive element 566 being a series inductor.

In general, a given configuration of an impedance matching circuit may be associated with a specific impedance tuning curve, which indicates impedance values achievable by that configuration. Different impedance matching circuit configurations may be associated with different impedance tuning curves, as shown in FIGS. 6A to 6D. An impedance matching circuit having only one configuration may be able to match to limited impedance values. For example, impedance matching circuit 410 with an "L" configuration in FIG. 4 may be able to match to impedance values within an impedance tuning curve for the "L" configuration. Performance may be degraded due to the limited impedance values to which impedance matching circuit 410 can match.

In an aspect, a reconfigurable impedance matching circuit with multiple configurations may be implemented with a set of reactive elements and a set of switches. The reactive elements and the switches may be connected in a particular topology, which may indicate how each reactive element and each switch is connected. A number of configurations may be supported with different settings of the switches. Different configurations may be associated with different impedance tuning curves. This may enable the reconfigurable impedance matching circuit to provide better impedance matching for a load circuit (e.g., an antenna) over a wider range of impedance values.

In an exemplary design, a reconfigurable impedance matching circuit includes at least one variable reactive element, each having an impedance that can be varied. The variable reactive element(s) enable the impedance of the reconfigurable impedance matching circuit to be tuned to provide better impedance matching, which may improve performance.

In an exemplary design, a reconfigurable impedance matching circuit includes at least one reconfigurable reactive element, each of which can be connected as a series element or a shunt element via switches. For example, a reconfigurable inductor may be connected as a series inductor in one configuration and as a shunt inductor in another configuration. The reconfigurable reactive element(s) enable the impedance of the reconfigurable impedance matching circuit to be tuned over a wider range of impedance values, which may provide better impedance matching.

Figure 7:
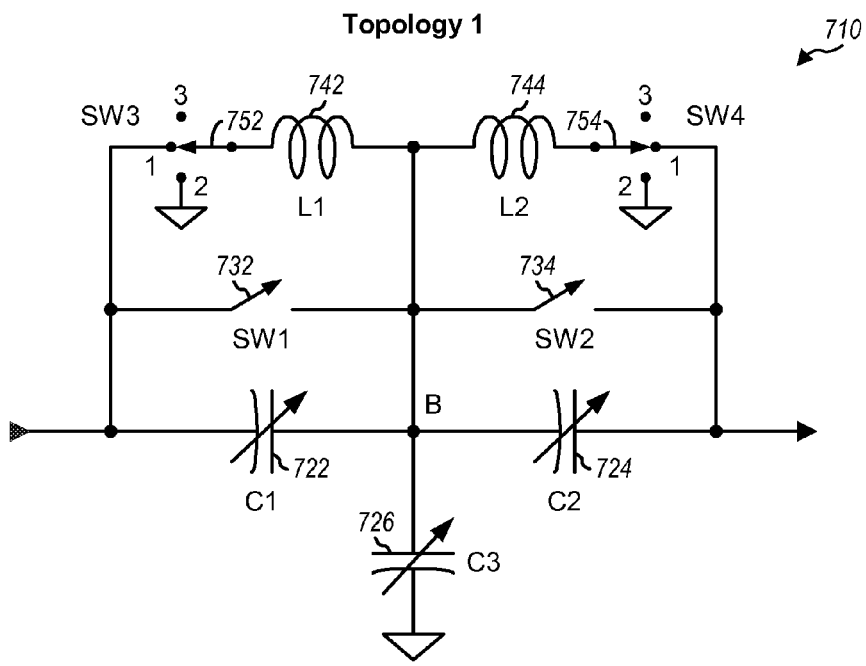
FIG. 7 shows a schematic diagram of a reconfigurable impedance matching circuit.

FIG. 7 shows a schematic diagram of an exemplary design of a reconfigurable impedance matching circuit 710. Within impedance matching circuit 710, a varactor 722 (C1) is coupled between an input of impedance matching circuit 710 and node B. A varactor 724 (C2) is coupled between node B and an output of impedance matching circuit 710. A varactor 726 (C3) is coupled between node B and circuit ground. A switch 732 (SW1) is coupled between the input of impedance matching circuit 710 and node B. A switch 734 (SW2) is coupled between node B and the output of impedance matching circuit 710. An inductor 742 (L1) is coupled between node B and an input of a switch 752 (SW3). Switch 752 has a first output ('1') coupled to the input of impedance matching circuit 710, a second output ('2') coupled to circuit ground, and a third output ('3') that floats and is not coupled to any circuit element. An inductor 744 (L2) is coupled between node B and an input of a switch 754 (SW4). Switch 754 has a first output ('1') coupled to the output of impedance matching circuit 710, a second output ('2') coupled to circuit ground, and a floating third output ('3').

Switch 752 may be implemented with (i) a first switch coupled between inductor L1 and the input of impedance matching circuit 710 and (ii) a second switch coupled between inductor L1 and circuit ground. Inductor L may be connected to the first output (which corresponds to the input of impedance matching circuit 710) by closing the first switch and opening the second switch. Inductor L1 may be connected to the second output (which corresponds to circuit ground) by opening the first switch and closing the second switch. Inductor L1 may be connected to the third output by opening both the first and second switches. Switch 754 may also be implemented with a pair of switches in a similar manner as switch 752.

Switches SW1 and SW2 may each be opened or closed (i.e., placed in one of two possible states). Switches SW3 and SW4 may each be controlled to connect the input to the first, second, or third output (i.e., placed in one of three possible states). Varactors C1, C2 and C3 may each be set to a minimum capacitance value to obtain a high impedance and essentially provide an open. Varactors C1, C2 and C3 may have the same or different minimum capacitance values. Inductors 742 and 744 may each be coupled as a series element or a shunt element, as described below.

In general, a reconfigurable impedance matching circuit can support up to $$\prod_{m=1}^{M} N_m$$

configurations, where $N_m$ is the number of states of the m-th switch in the reconfigurable impedance matching circuit, M is the total number of switches, and "Π" denotes a product operation. For example, impedance matching circuit 710 may support up to 36=2*2*3*3 configurations with two states for each of switches SW1 and SW2 and three states for each of switches SW3 and SW4.

Impedance matching circuit 710 supports a number of configurations including series, shunt, "L", "R", and "T" configurations. Some configurations of impedance matching circuit 710 are described below. Each configuration is associated with a set of states/settings for switches SW1, SW2, SW3 and SW4. Each configuration may also be associated with specific values for varactors C1, C2 and/or C3.

Figure 8A:
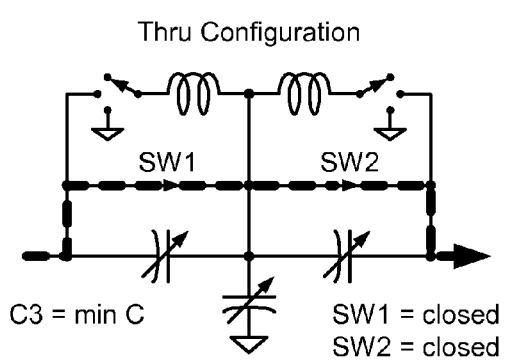
FIGS. 8A to 8T show 20 configurations of the reconfigurable impedance matching circuit in FIG. 7.

FIGS. 8A to 8T show 20 configurations of impedance matching circuit 710 in FIG. 7. Each configuration may be obtained with the switch settings and varactor settings shown in a figure describing that configuration. For each configuration, the main electrical path is shown by a heavy dashed line.

FIG. 8A shows impedance matching circuit 710 in a through configuration. In this configuration, an input signal is passed through switches SW1 and SW2 to the output of impedance matching circuit 710.

Figure 8B:
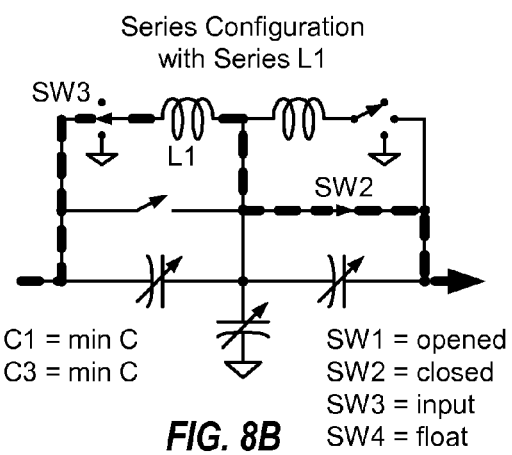

FIG. 8B shows impedance matching circuit 710 in a series configuration with a series L1. In this configuration, an input signal is passed through switch SW3, inductor L1, and switch SW2 to the output of impedance matching circuit 710.

FIG. 8C shows impedance matching circuit 710 in a series configuration with a series C1. In this configuration, an input signal is passed through varactor C1 and switch SW2 to the output of impedance matching circuit 710.

FIG. 8D shows impedance matching circuit 710 in a series configuration with series C1 and C2. In this configuration, an input signal is passed through varactors C1 and C2 to the output of impedance matching circuit 710.

FIG. 8E shows impedance matching circuit 710 in a series configuration with a series L2. In this configuration, an input signal is passed through switch SW1, inductor L2, and switch SW4 to the output of impedance matching circuit 710.

FIG. 8F shows impedance matching circuit 710 in a series configuration with series L1 and L2. In this configuration, an input signal is passed through switch SW3, inductors L1 and L2, and switch SW4 to the output of impedance matching circuit 710.

FIG. 8G shows impedance matching circuit 710 in a series configuration with series C1 and L2. In this configuration, an input signal is passed through varactor C1, inductor L2, and switch SW4 to the output of impedance matching circuit 710.

FIG. 8H shows impedance matching circuit 710 in a series configuration with series L1 and C2. In this configuration, an input signal is passed through switch SW3, inductor L1, and varactor C2 to the output of impedance matching circuit 710.

Figure 8I:
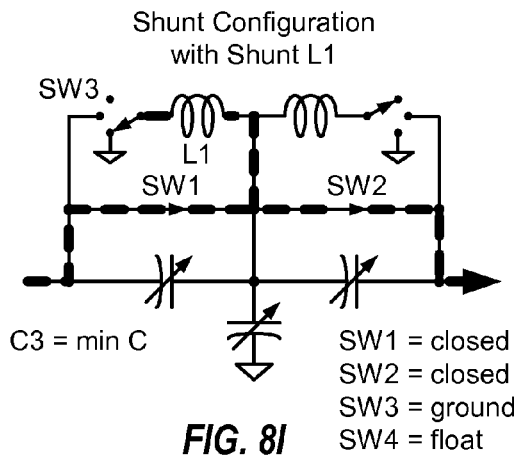

FIG. 8I shows impedance matching circuit 710 in a shunt configuration with a shunt L1. In this configuration, an input signal is passed through switch SW1, applied to inductor L1 (which is coupled to circuit ground via switch SW3), and passed through switch SW2 to the output of impedance matching circuit 710.

Figure 8J:
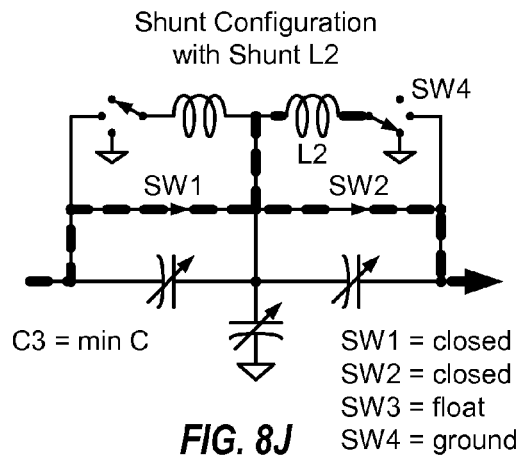

FIG. 8J shows impedance matching circuit 710 in a shunt configuration with a shunt L2. In this configuration, an input signal is passed through switch SW1, applied to inductor L2 (which is coupled to circuit ground via switch SW4), and passed through switch SW2 to the output of impedance matching circuit 710.

Figure 8K:
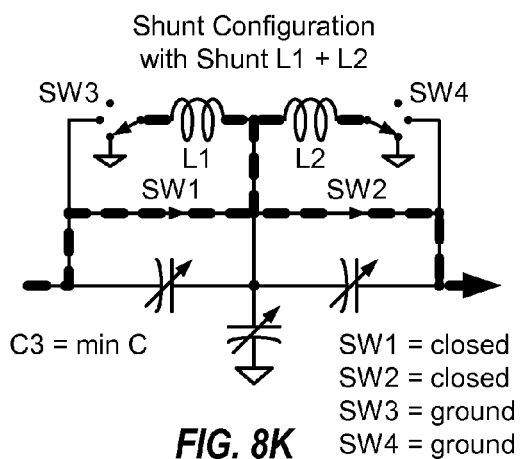

FIG. 8K shows impedance matching circuit 710 in a shunt configuration with shunt L1 and L2. In this configuration, an input signal is passed through switch SW1, applied to inductors L1 and L2 (which are coupled to circuit ground via switches SW3 and SW4), and passed through switch SW2 to the output of impedance matching circuit 710.

Figure 8L:
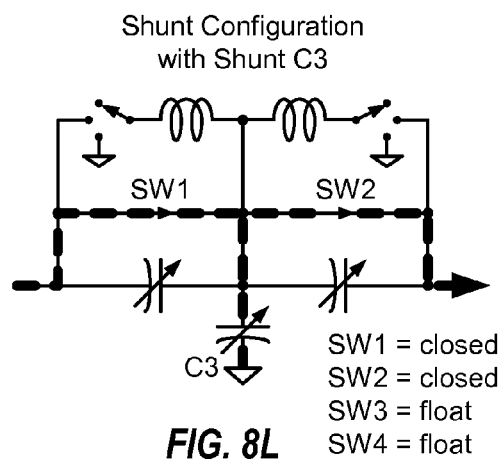

FIG. 8L shows impedance matching circuit 710 in a shunt configuration with a shunt C3. In this configuration, an input signal is passed through switch SW1, applied to varactor C3, and passed through switch SW2 to the output of impedance matching circuit 710.

Figure 8M:
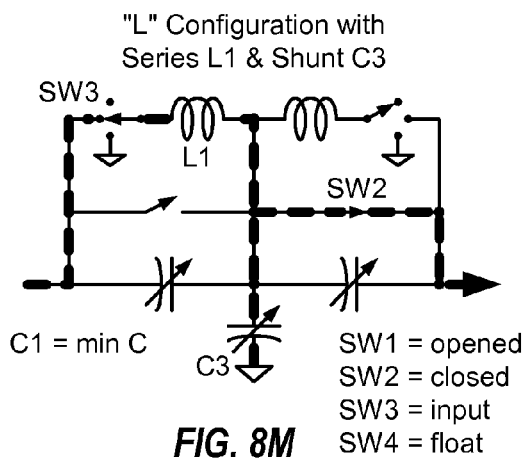

FIG. 8M shows impedance matching circuit 710 in an "L" configuration with series L1 and shunt C3. In this configuration, an input signal is passed through switch SW3 and inductor L1, applied to varactor C3, and passed through switch SW2 to the output of impedance matching circuit 710.

Figure 8N:
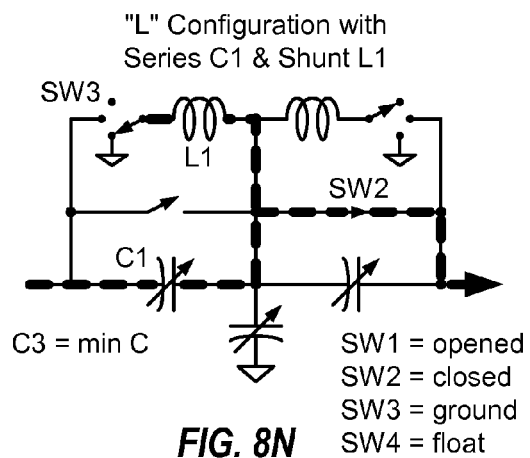

FIG. 8N shows impedance matching circuit 710 in an "L" configuration with series C1 and shunt L1. In this configuration, an input signal is passed through varactor C1, applied to inductor L1 (which is coupled to circuit ground via switch SW3), and passed through switch SW2 to the output of impedance matching circuit 710.

FIG. 8O shows impedance matching circuit 710 in an "R" configuration with shunt L2 and series C2. In this configuration, an input signal is passed through switch SW1, applied to inductor L2 (which is coupled to circuit ground via switch SW4), and passed through varactor C2 to the output of impedance matching circuit 710.

FIG. 8P shows impedance matching circuit 710 in an "R" configuration with shunt C3 and series L2. In this configuration, an input signal is passed through switch SW1, applied to varactor C3, and passed through inductor L2 and switch SW4 to the output of impedance matching circuit 710.

FIG. 8Q shows impedance matching circuit 710 in a "T" configuration with series L1, shunt C3, and series L2. In this configuration, an input signal is passed through switch SW3 and inductor L1, applied to varactor C3, and passed through inductor L2 and switch SW4 to the output of impedance matching circuit 710.

FIG. 8R shows impedance matching circuit 710 in a "T" configuration with series C1, shunt L1, and series C2. In this configuration, an input signal is passed through varactor C1, applied to inductor L1 (which is coupled to circuit ground via switch SW3), and passed through varactor C2 to the output of impedance matching circuit 710.

FIG. 8S shows impedance matching circuit 710 in a "T" configuration with series C1, shunt L2, and series C2. In this configuration, an input signal is passed through varactor C1, applied to inductor L2 (which is coupled to circuit ground via switch SW4), and passed through varactor C2 to the output of impedance matching circuit 710.

FIG. 8T shows impedance matching circuit 710 in a "T" configuration with series C1, shunt L1 and L2, and series C2. In this configuration, an input signal is passed through varactor C1, applied to inductors L1 and L2 (which are coupled to circuit ground via switches SW3 and SW4), and passed through varactor C2 to the output of impedance matching circuit 710.

FIG. 7 shows one topology of a reconfigurable impedance matching circuit with a number of configurations shown in FIGS. 8A to 8T. A reconfigurable impedance matching circuit may also be implemented with other topologies.

Figure 9A:
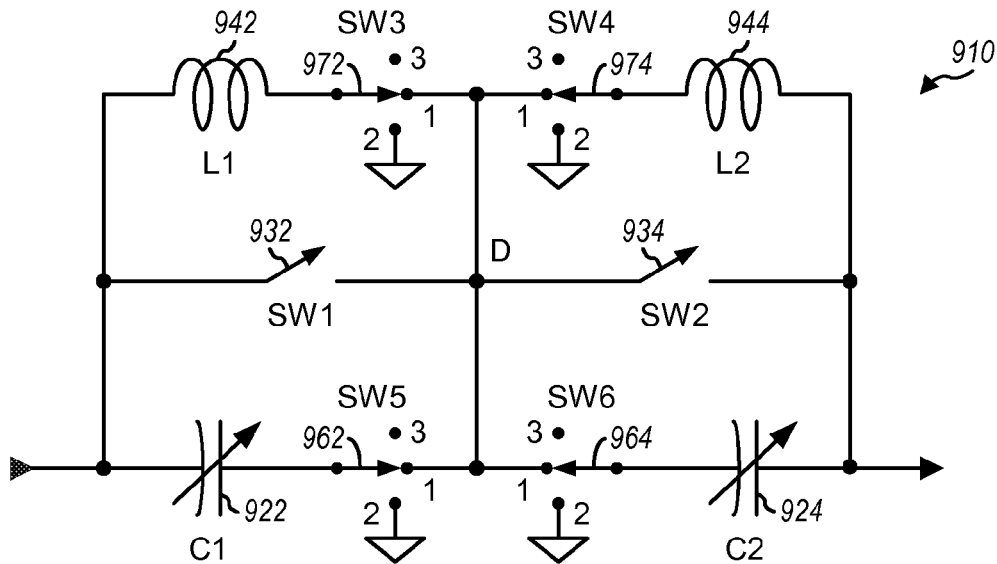
FIGS. 9A to 9C show schematic diagrams of three reconfigurable impedance matching circuits.

FIG. 9A shows a schematic diagram of an exemplary design of a reconfigurable impedance matching circuit 910. Within impedance matching circuit 910, a varactor 922 (C1) is coupled between an input of impedance matching circuit 910 and an input of a switch 962 (SW5). Switch 962 has a first output coupled to node D, a second output coupled to circuit ground, and a floating third output. A varactor 924 (C2) is coupled between an output of impedance matching circuit 910 and an input of a switch 964 (SW6). Switch 964 has a first output coupled to node D, a second output coupled to circuit ground, and a floating third output. A switch 932 (SW1) is coupled between the input of impedance matching circuit 910 and node D. A switch 934 (SW2) is coupled between node D and the output of impedance matching circuit 910. An inductor 942 (L1) is coupled between the input of impedance matching circuit 910 and an input of a switch 972 (SW3). Switch 972 has a first output coupled to node D, a second output coupled to circuit ground, and a floating third output. An inductor 944 (L2) is coupled between the output of impedance matching circuit 910 and an input of a switch 974 (SW4). Switch 974 has a first output coupled to node D, a second output coupled to circuit ground, and a floating third output.

Switches SW1 and SW2 may each be opened or closed. Switches SW3, SW4, SW5 and SW6 may each be set to connect the input to one of three outputs. Varactors C1 and C2 and inductors L1 and L2 may each be coupled as a series element or a shunt element via their associated switches SW5, SW6, SW3 and SW4, respectively.

Figure 9B:
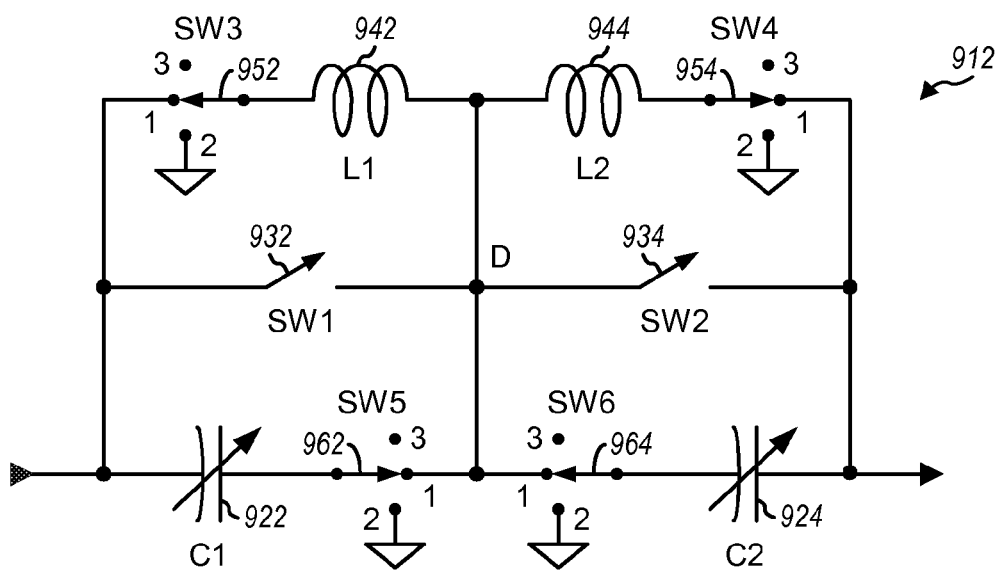

FIG. 9B shows a schematic diagram of an exemplary design of a reconfigurable impedance matching circuit 912. Impedance matching circuit 912 includes varactors 922 and 924 and switches 932, 934, 962 and 964, which are coupled as described above for FIG. 9A. Inductor 942 (L1) is coupled between node D and an input of a switch 952 (SW3). Switch 952 has a first output coupled to the input of impedance matching circuit 912, a second output coupled to circuit ground, and a floating third output. Inductor 944 (L2) is coupled between node D and an input of a switch 954 (SW4). Switch 954 has a first output coupled to the output of impedance matching circuit 912, a second output coupled to circuit ground, and a floating third output.

Switches SW1 and SW2 may each be opened or closed. Switches SW3, SW4, SW5 and SW6 may each connect the input to one of three outputs. Varactors C1 and C2 and inductors L1 and L2 may each be coupled as a series element or a shunt element via their associated switches SW5, SW6, SW3 and SW4, respectively.

Figure 9C:
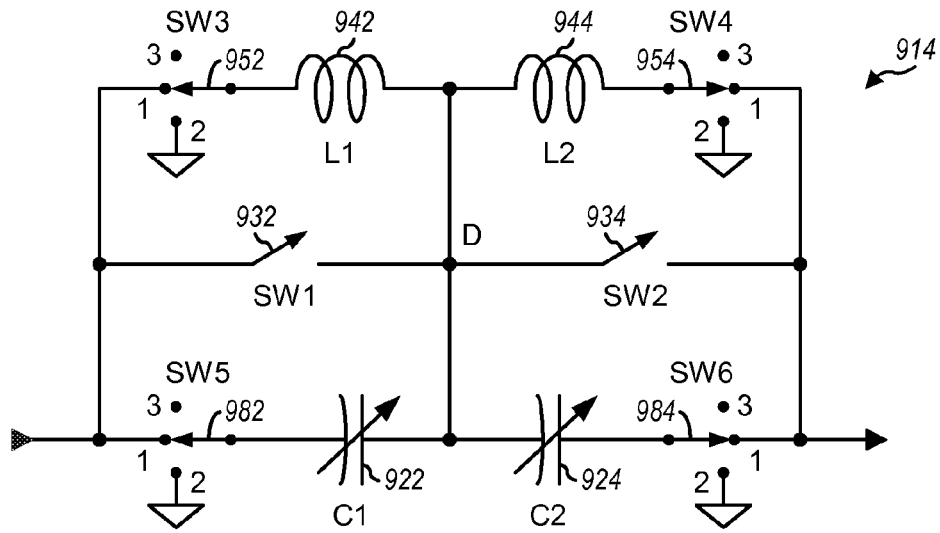

FIG. 9C shows a schematic diagram of an exemplary design of a reconfigurable impedance matching circuit 914. Impedance matching circuit 914 includes inductors 942 and 944 and switches 932, 934, 952 and 954, which are coupled as described above for FIGS. 9A and 9B. Varactor 922 (C1) is coupled between node D and an input of a switch 982 (SW5). Switch 982 has a first output coupled to the input of impedance matching circuit 914, a second output coupled to circuit ground, and a floating third output. Varactor 924 (C2) is coupled between node D and an input of a switch 984 (SW6). Switch 984 has a first output coupled to the output of impedance matching circuit 914, a second output coupled to circuit ground, and a floating third output.

Switches SW1 and SW2 may each be opened or closed. Switches SW3, SW4, SW5 and SW6 may each connect the input to one of three outputs. Varactors C1 and C2 and inductors L1 and L2 may each be coupled as a series element or a shunt element via their associated switches SW5, SW6, SW3 and SW4, respectively.

FIGS. 7, 9A, 9B and 9C show four exemplary topologies for a reconfigurable impedance matching circuit. The topology in FIG. 7 allows inductors L1 and L2 to be connected as series elements or shunt elements. The topology in FIG. 9A allows inductors L1 and L2 and varactors C1 and C2 to be connected as series elements or shunt elements in a "Pi" configuration. The topology in FIG. 9B allows varactors C1 and C2 to be connected as series elements or shunt elements in a "Pi" configuration and allows inductors L1 and L2 to be connected as series elements or shunt elements in a "T" configuration. The topology in FIG. 9C allows varactors C1 and C2 and inductors L1 and L2 to be connected as series elements or shunt elements in a "T" configuration. A reconfigurable impedance matching circuit may also be implemented based on other topologies.

In general, a topology for a reconfigurable impedance matching circuit may include any number of reactive elements and any number of switches, which may be coupled in any manner. A topology may support any number of configurations. For example, a topology may support one or more of the following configurations:

Through configuration without any L or C,
Series configuration in FIG. 5A with series L and/or series C,
Shunt configuration in FIG. 5B with shunt L and/or shunt C,
"L" configuration in FIG. 5C with (i) series C and shunt L, (ii) series L and shunt C, (iii) series C and shunt C, or (iv) series L and shunt L,
"R" configuration in FIG. 5D with (i) shunt C and series L, (ii) shunt L and series C, (iii) shunt C and series C, or (iv) shunt L and series L,
"Pi" configuration in FIG. 5E with (i) shunt C, series L, and shunt C or (ii) shunt L, series C, and shunt L,
"T" configuration in FIG. 5F with (i) series C, shunt L, and series C or (ii) series L, shunt C, and series L, and
Other configurations.

In an exemplary design, varactors and switches in a reconfigurable impedance matching circuit may be implemented on an integrated circuit (IC), and inductors may be implemented external to the IC. In another exemplary design, capacitors, switches, and inductors in a reconfigurable impedance matching circuit may be implemented on an IC. In yet another exemplary design, capacitors, switches, and inductors in a reconfigurable impedance matching circuit may be implemented on a circuit board. Capacitors, switches, and inductors in a reconfigurable impedance matching circuit may also be implemented in other manners.

A reconfigurable impedance matching circuit may provide better impedance matching for an antenna. The impedance of the antenna may vary widely from one antenna design to another. Furthermore, the antenna impedance may vary widely with frequency. The antenna impedance may also change due to proximity of human body (e.g., hand, face, etc.) on a wireless device. The reconfigurable impedance matching circuit may match the impedance of the antenna to a target impedance so that good performance can be achieved.

Figure 10:
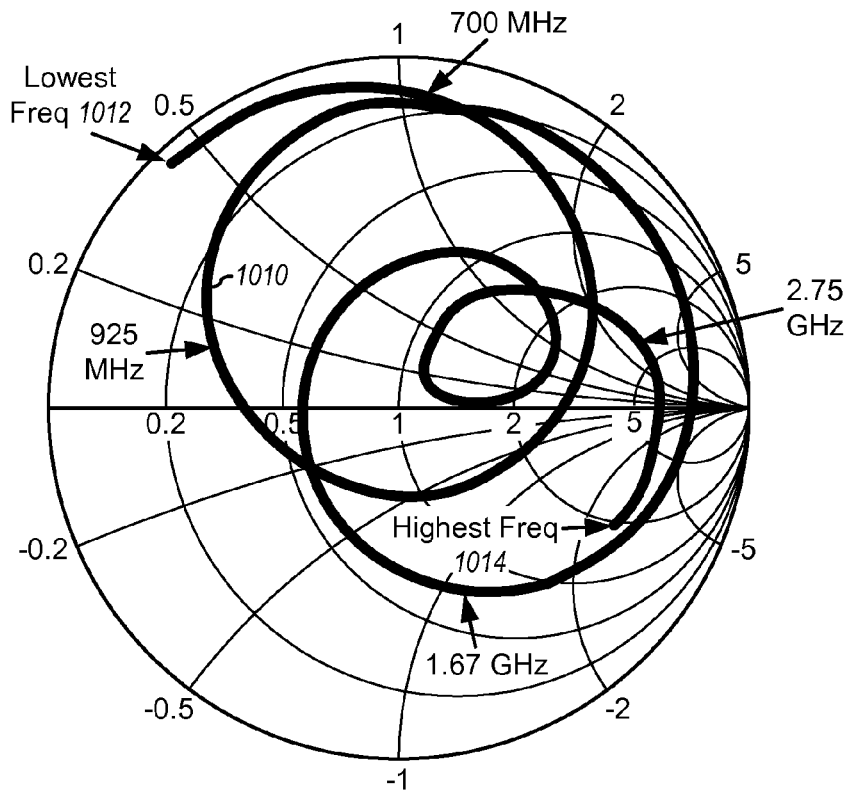
FIG. 10 shows a Smith chart of the impedance of an antenna versus frequency.

FIG. 10 shows a Smith chart illustrating the impedance of an antenna versus frequency. A plot 1010 shows the antenna impedance from below 700 MHz at point 1012 to above 2.8 GHz at point 1014. The antenna has a particular impedance ($Z_{ANT}$) at a given frequency of operation. An impedance matching circuit should match this $Z_{ANT}$ impedance to an impedance of a circuit coupled to the antenna (e.g., an impedance of a filter). If the impedance matching circuit has a single configuration (e.g., impedance matching circuit 410 in FIG. 4), then the impedance matching circuit may not be able to match to the $Z_{ANT}$ impedance, thereby resulting in performance degradation. However, if the impedance matching circuit has multiple configurations, then a configuration with an impedance tuning curve as close to the $Z_{ANT}$ impedance as possible may be selected, and one or more variable reactive elements may be adjusted to match to the $Z_{ANT}$ impedance.

A reconfigurable impedance matching circuit may be used for impedance matching of a load circuit (e.g., an antenna) in various manners. The load circuit may have different impedance values at different frequencies, e.g., as shown in FIG. 10. The reconfigurable impedance matching circuit should match the impedance of the load circuit at a selected operating frequency.

In one exemplary design, a number of settings of a reconfigurable impedance matching circuit (or circuit settings) may be determined for a load circuit at different frequencies. Each circuit setting may be associated with an impedance ($Z_{MC}$) of the reconfigurable impedance matching circuit that most closely matches an impedance ($Z_{LOAD}$) of the load circuit at a particular frequency. The $Z_{LOAD}$ impedance may be determined based on measurements (e.g., in a laboratory or a factory) and/or computer simulation of the load circuit at the particular frequency. The $Z_{MC}$ impedance may be determined based on measurements and/or computer simulation of the reconfigurable impedance matching circuit at the particular frequency.

Figures 11, 13:
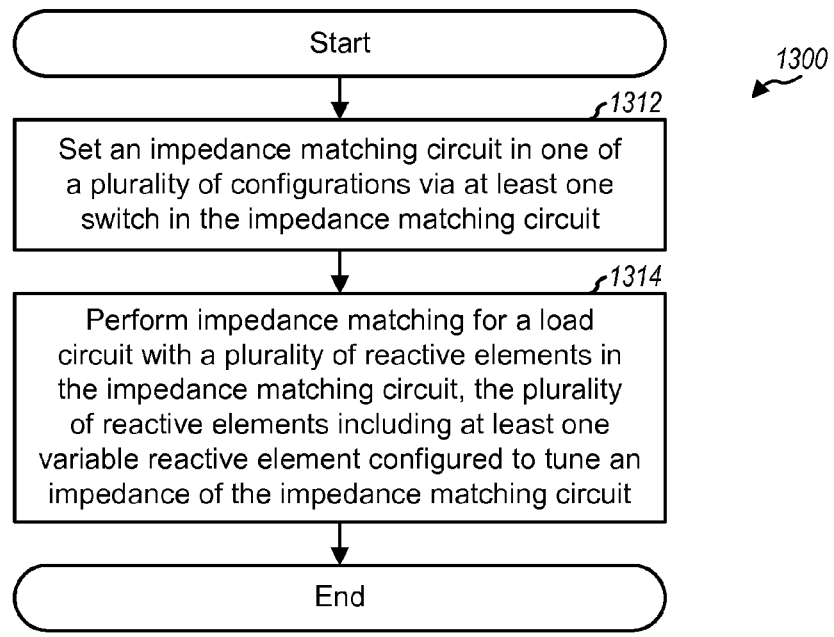
FIG. 11 shows a look-up table for a reconfigurable impedance matching circuit.
FIG. 13 shows a process for performing impedance matching.

FIG. 11 shows an exemplary design of a look-up table (LUT) 1100 for a reconfigurable impedance matching circuit. In this exemplary design, K circuit settings of the reconfigurable impedance matching circuit may be determined for a load circuit at K different frequencies, where K may be any integer value. Each circuit setting may be associated with (i) a frequency or a range of frequencies at which the circuit setting may be selected, (ii) a specific configuration of the reconfigurable impedance matching circuit, (iii) specific settings of switches in the reconfigurable impedance matching circuit, (iv) specific control settings for variable reactive elements in the reconfigurable impedance matching circuit, and (v) a frequency band and/or a mode (e.g., cdma2000, WCDMA, LTE, GSM, etc.) in which the circuit setting may be selected. All or some of the information in look-up table 1100 may be stored in a non-volatile memory (e.g., memory 112 in FIG. 1). For example, look-up table 1100 may store only the frequency or frequency range, the switch settings, and the control settings for variable reactive elements for each circuit setting.

With look-up table 1100, impedance matching may be performed by selecting a suitable circuit setting based on an operating frequency of a wireless device. The switch settings and the control settings for the selected circuit setting may be retrieved from look-up table 1100. The retrieved switch settings may be applied to switches, and the retrieved control settings may be applied to variable reactive elements within the reconfigurable impedance matching circuit.

Figure 12:
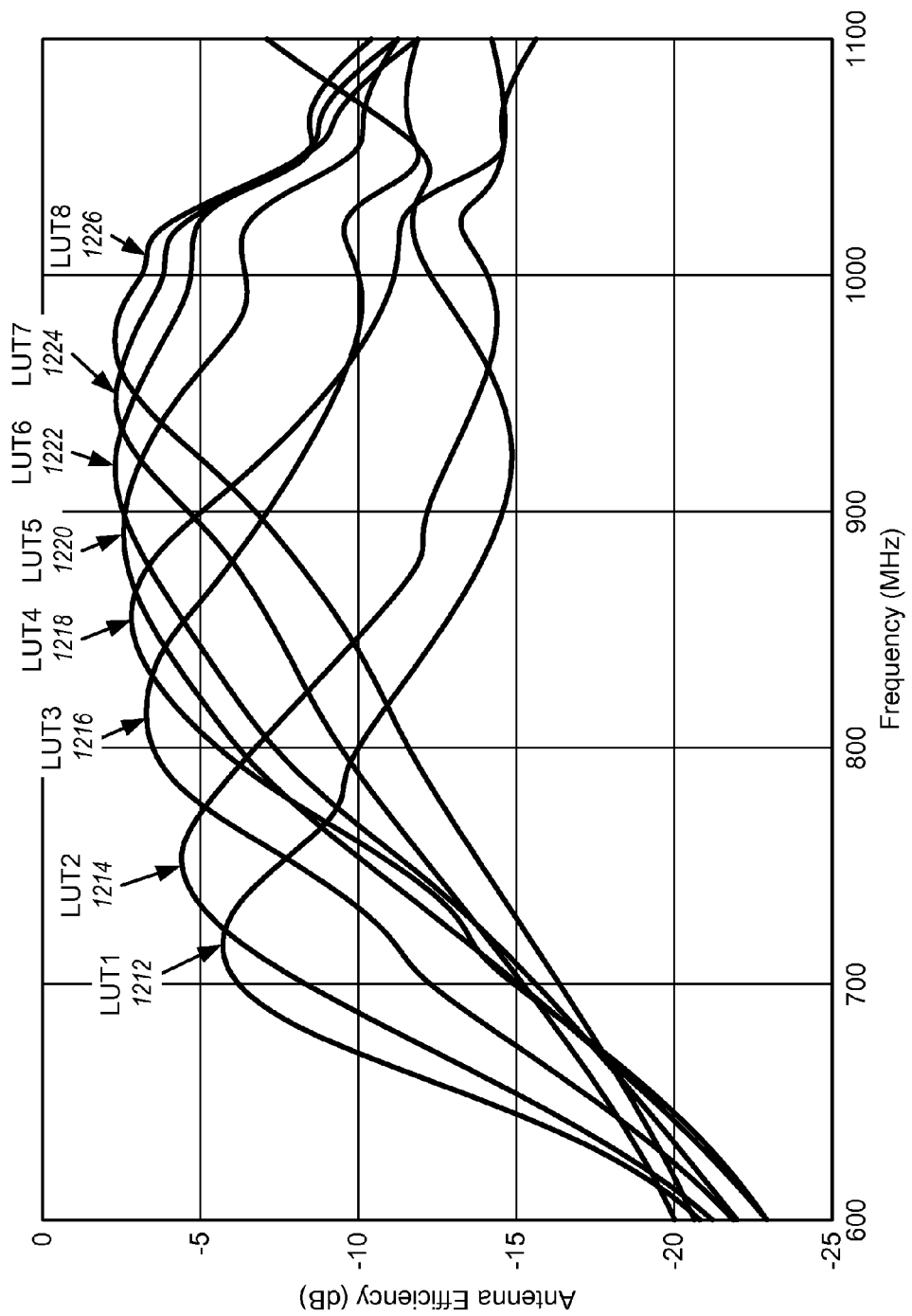
FIG. 12 shows plots of antenna efficiency for eight different settings of a reconfigurable impedance matching circuit.

FIG. 12 shows plots of antenna efficiency for eight different circuit settings for low frequency band in accordance with one exemplary design. In FIG. 12, the horizontal axis represents frequency in units of MHz, and the vertical axis represents antenna efficiency in units of decibel (dB). Antenna efficiency versus frequency for eight different circuit settings denoted as LUT1 through LUT8 is shown by plots 1212 through 1226, respectively. As shown in FIG. 12, each circuit setting has a peak antenna efficiency at a particular frequency and may provide good performance for a range of frequencies covering the peak antenna efficiency. The eight circuit settings may be chosen such that the peak antenna efficiency for these eight circuit settings occurs at different frequencies, which may be spaced apart as evenly as possible. One circuit setting may be selected for use based on the operating frequency. For example, the LUT3 setting may be selected when operating at 800 MHz, the LUT5 setting may be selected when operating at 900 MHz, etc. The frequency response for the selected LUT setting may be varied by adjusting one or more variable reactive elements in the reconfigurable impedance matching circuit.

In another exemplary design, impedance matching may be adaptively performed with a reconfigurable impedance matching circuit. For example, an initial circuit setting comprising an initial configuration and initial control settings for variable reactive elements in the reconfigurable impedance matching circuit may be applied. A performance metric may be determined for this initial circuit setting. The performance metric may be defined based on one or more parameters such as power delivered to a load circuit, power reflected from the load circuit, power amplifier current, etc. The configuration and/or the control settings may be varied (e.g., randomly or based on a search algorithm) to obtain a new circuit setting. A performance metric may be determined for the new circuit setting. The new circuit setting may be retained if the performance metric for the new circuit setting is better than the performance metric for the initial circuit setting. The configuration and/or the control settings may be iteratively varied and evaluated in similar manner until the best performance metric is obtained.

A reconfigurable impedance matching circuit with multiple configurations described herein may provide various advantages. The reconfigurable impedance matching circuit may support a wide impedance tuning range and may be able to provide better impedance matching. The reconfigurable impedance matching circuit may also support adaptive impedance matching with a load such as an antenna. The reconfigurable impedance matching circuit can support operation on a single frequency band or multiple frequency bands and may be able to extend the frequency of operation of a wireless device. The reconfigurable impedance matching circuit may include a single input and a single output, which may enable ease of production testing and operation. The reconfigurable impedance matching circuit may be implemented with few (e.g., one or two) inductors, which may reduce cost and size. The reconfigurable impedance matching circuit may support carrier aggregation, which is simultaneous transmission on multiple carriers. Each carrier may have a particular bandwidth (e.g., 20 MHz or less). The reconfigurable impedance matching circuit may also support multiple-input-multiple-output (MIMO) operation, transmit diversity, receive diversity, etc.

In an exemplary design, an apparatus (e.g., a wireless device, an IC, a circuit module, etc.) may comprise an impedance matching circuit coupled to a load circuit. The impedance matching circuit (e.g., impedance matching circuit 150 in FIG. 1) may comprise a plurality of reactive elements and at least one switch and may support a plurality of configurations. Each configuration may correspond to specific placement and interconnection of the plurality of reactive elements in the impedance matching circuit. The plurality of reactive elements may be configured to impedance match the load circuit and may include at least one variable reactive element (e.g., at least one varactor) configured to tune an impedance of the impedance matching circuit. The at least one switch may be configured to set the impedance matching circuit in one of the plurality of configurations. The apparatus may further comprise a controller (e.g., controller 110) configured to select one of the plurality of configurations for the impedance matching circuit. The controller may be implemented with digital circuits and/or analog circuits.

In an exemplary design, the plurality of configurations may include a series configuration, a shunt configuration, an "L" configuration, an "R" configuration, a "Pi" configuration, a "T" configuration, or a combination thereof. The series configuration may have at least one reactive element coupled between an input and an output of the impedance matching circuit, e.g., as shown in FIG. 5A. The shunt configuration may have at least one reactive element coupled between the input/output of the impedance matching circuit and circuit ground, e.g., as shown in FIG. 5B. The "L" configuration may have (i) at least one reactive element coupled between the input and output of the impedance matching circuit and (ii) at least one other reactive element coupled between the output of the impedance matching circuit and circuit ground, e.g., as shown in FIG. 5C. The "R" configuration may have (i) at least one reactive element coupled between the input and output of the impedance matching circuit and (ii) at least one other reactive element coupled between the input of the impedance matching circuit and circuit ground, e.g., as shown in FIG. 5D. The "Pi" configuration may have (i) a first reactive element coupled between the input and output of the impedance matching circuit, (ii) a second reactive element coupled between the input of the impedance matching circuit and circuit ground, and (iii) a third reactive element coupled between the output of the impedance matching circuit and circuit ground, e.g., as shown in FIG. 5E. The "T" configuration may have (i) a first reactive element coupled between the input of the impedance matching circuit and an intermediate node, (ii) a second reactive element coupled between the intermediate node and the output of the impedance matching circuit, and (iii) a third reactive element coupled between the intermediate node and circuit ground, e.g., as shown in FIG. 5F. The plurality of configurations may be associated with different impedance tuning curves, e.g., as shown in FIGS. 6A to 6D.

In an exemplary design, the plurality of reactive elements may include a reactive element coupled as a series element in at least one configuration and as a shunt element in at least one other configuration. The reactive element may be an inductor (e.g., inductor 742 or 744 in FIG. 7) coupled as a series inductor in at least one configuration (e.g., as shown in FIGS. 8B, 8E, 8F, 8G, 8H, etc.) and as a shunt inductor in at least one other configuration (e.g., as shown in FIGS. 8I, 8J, 8K, 8N, 8O, etc.). Alternatively, the reactive element may be a variable capacitor (e.g., capacitor 922 or 924 in FIG. 9B) coupled as a series capacitor in at least one configuration and as a shunt capacitor in at least one other configuration.

The plurality of reactive elements may include a reactive element coupled (i) between a first pair of nodes in the impedance matching circuit in at least one configuration and (ii) between a second pair of nodes different from the first pair of nodes in at least one other configuration. For example, inductor 742 in FIG. 7 may be coupled between node B and the input of impedance matching circuit 710 or between node B and circuit ground. The at least one switch may include a switch (e.g., switch 752 or 754 in FIG. 7) having (i) a single input coupled to one of the plurality of reactive elements and (ii) at least two outputs coupled to at least two nodes in the impedance matching circuit.

In an exemplary design, the load circuit may comprise an antenna, and the impedance matching circuit may perform impedance matching for the antenna, e.g., as shown in FIGS. 1 and 2. In another exemplary design, the load circuit may comprise a power amplifier, and the impedance matching circuit may perform output impedance matching for the power amplifier, e.g., as shown in FIG. 3. In yet another exemplary design, the load circuit may comprise an LNA, and the impedance matching circuit may perform input impedance matching for the LNA, e.g., as shown in FIG. 3.

In an exemplary design, the apparatus may further comprise a memory that stores a plurality of circuit settings for the impedance matching circuit, e.g., as shown in FIG. 11. Each circuit setting may be associated with one of the plurality of configurations, at least one switch setting for the at least one switch, at least one control setting for the at least one variable reactive element, etc. In an exemplary design, the plurality of circuit settings may be for different frequencies, e.g., as shown in FIG. 12. One of the plurality of circuit settings may be selected based on an operating frequency of the apparatus.

FIG. 13 shows an exemplary design of a process 1300 for performing impedance matching. An impedance matching circuit may be set to one of a plurality of configurations via at least one switch in the impedance matching circuit (block 1312). Impedance matching may be performed for a load circuit with a plurality of reactive elements in the impedance matching circuit (block 1314). The plurality of reactive elements may include at least one variable reactive element configured to tune an impedance of the impedance matching circuit.

In an exemplary design, a plurality of circuit settings for the impedance matching circuit may be stored in a memory. Each circuit setting may be associated with one of the plurality of configurations, at least one switch setting for the at least one switch, at least one control setting for the at least one variable reactive element, etc. One of the plurality of circuit settings for the impedance matching circuit may be selected, e.g., based on an operating frequency of a wireless device.

A reconfigurable impedance matching circuit described herein may be implemented on an IC, an analog IC, an RFIC, a mixed-signal IC, an ASIC, a printed circuit board (PCB), an electronic device, etc. The reconfigurable impedance matching circuit may be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus with a reconfigurable impedance matching circuit, as described herein, may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   an impedance matching circuit comprising:
      a plurality of reactive elements configured to impedance match a load circuit and including at least one variable reactive element configured to tune an impedance of the impedance matching circuit, and
      at least one switch configured to set the impedance matching circuit in one of a plurality of configurations, wherein the plurality of reactive elements include a reactive element coupled as a series element in at least one configuration and as a shunt element in at least one other configuration.

2. The apparatus of claim 1, wherein the plurality of configurations include at least one of a series configuration, a shunt configuration, an "L" configuration, an "R" configuration, a "Pi" configuration, or a "T" configuration.

3. The apparatus of claim 1, wherein the plurality of configurations include a series configuration having at least one reactive element coupled between an input and an output of the impedance matching circuit.

4. The apparatus of claim 1, wherein the plurality of configurations include a shunt configuration having at least one reactive element coupled between an output of the impedance matching circuit and circuit ground.

5. The apparatus of claim 1, wherein the plurality of configurations include an "L" configuration having at least one reactive element coupled between an input and an output of the impedance matching circuit and at least one other reactive element coupled between the output of the impedance matching circuit and circuit ground.

6. The apparatus of claim 1, wherein the plurality of configurations include an "R" configuration having at least one reactive element coupled between an input and an output of the impedance matching circuit and at least one other reactive element coupled between the input of the impedance matching circuit and circuit ground.

7. The apparatus of claim 1, wherein the plurality of configurations include a "Pi" configuration having a first reactive element coupled between an input and an output of the impedance matching circuit, a second reactive element coupled between the input of the impedance matching circuit and circuit ground, and a third reactive element coupled between the output of the impedance matching circuit and circuit ground.

8. The apparatus of claim 1, wherein the plurality of configurations include a "T" configuration having a first reactive element coupled between an input of the impedance matching circuit and an intermediate node, a second reactive element coupled between the intermediate node and an output of the impedance matching circuit, and a third reactive element coupled between the intermediate node and circuit ground.

9. The apparatus of claim 1, wherein the plurality of reactive elements include an inductor coupled as a series inductor in at least one configuration and as a shunt inductor in at least one other configuration.

10. The apparatus of claim 1, wherein the plurality of reactive elements include a variable capacitor coupled as a series capacitor in at least one configuration and as a shunt capacitor in at least one other configuration.

11. The apparatus of claim 1, wherein the plurality of reactive elements include a reactive element coupled between a first pair of nodes in the impedance matching circuit in at least one configuration and between a second pair of nodes different from the first pair of nodes in at least one other configuration.

12. The apparatus of claim 1, wherein the at least one switch includes a switch having a single input coupled to one of the plurality of reactive elements and at least two outputs coupled to at least two nodes in the impedance matching circuit.

13. The apparatus of claim 1, wherein the load circuit comprises an antenna, and wherein the impedance matching circuit performs impedance matching for the antenna.

14. The apparatus of claim 1, wherein the load circuit comprises a power amplifier, and wherein the impedance matching circuit performs output impedance matching for the power amplifier.

15. The apparatus of claim 1, wherein the load circuit comprises a low noise amplifier (LNA), and wherein the impedance matching circuit performs input impedance matching for the LNA.

16. The apparatus of claim 1, further comprising:
   a controller configured to select one of the plurality of configurations of the impedance matching circuit.

17. The apparatus of claim 1, further comprising:
   a memory configured to store a plurality of circuit settings for the impedance matching circuit, each circuit setting being associated with one of the plurality of configurations, at least one switch setting for the at least one switch, at least one control setting for the at least one variable reactive element, or a combination thereof.

18. The apparatus of claim 17, wherein the plurality of circuit settings are associated with different frequencies, and wherein one of the plurality of circuit settings is selected based on an operating frequency of the apparatus.

19. The apparatus of claim 1, wherein the apparatus comprises an integrated circuit.

20. An apparatus for wireless communication, comprising:
means for performing impedance matching for a load circuit, the means for performing impedance matching including at least one variable reactive element configured to tune an impedance of the means for performing impedance matching; and
means for setting the means for performing impedance matching in one of a plurality of configurations, wherein the at least one reactive element includes a reactive element coupled as a series element in at least one configuration and as a shunt element in at least one other configuration.

21. The apparatus of claim 20, further comprising:
means for storing a plurality of settings for the means for performing impedance matching; and
means for selecting one of the plurality of settings for the means for performing impedance matching.

\* \* \* \* \*